(12) United States Patent
Heim

(10) Patent No.: US 7,626,319 B2
(45) Date of Patent: Dec. 1, 2009

(54) THREE-DIMENSIONAL ELECTROACTIVE POLYMER ACTUATED DEVICES

(75) Inventor: Jonathan R. Heim, Pacifica, CA (US)

(73) Assignee: Artificial Muscle, Inc., Sunnyvale, CA (US)

( * ) Notice: Subject to any disclaimer, the term of this patent is extended or adjusted under 35 U.S.C. 154(b) by 0 days.

(21) Appl. No.: 11/361,676

(22) Filed: Feb. 24, 2006

(65) Prior Publication Data
US 2007/0200466 A1 Aug. 30, 2007

Related U.S. Application Data

(63) Continuation-in-part of application No. 11/085,798, filed on Mar. 21, 2005, and a continuation-in-part of application No. 11/085,804, filed on Mar. 21, 2005, now Pat. No. 7,521,840.

(51) Int. Cl.
*H01L 41/00* (2006.01)
(52) U.S. Cl. .................. 310/800; 310/311; 310/324
(58) Field of Classification Search .......... 310/800, 310/311, 324
See application file for complete search history.

(56) References Cited

U.S. PATENT DOCUMENTS

| | | | |
|---|---|---|---|
| 4,283,649 A | 8/1981 | Heinouchi | |
| 4,284,921 A | 8/1981 | Lemonon et al. | |
| 4,605,167 A | 8/1986 | Maehara | |
| 4,654,554 A | 3/1987 | Kishi | |
| 4,911,057 A * | 3/1990 | Fishman | 84/731 |
| 5,085,401 A | 2/1992 | Botting et al. | |
| 5,831,371 A * | 11/1998 | Bishop | 310/328 |
| 5,900,572 A | 5/1999 | Aaroe | |
| 5,977,685 A | 11/1999 | Kurita et al. | |
| 6,343,129 B1 | 1/2002 | Pelrine et al. | |
| 6,376,971 B1 | 4/2002 | Pelrine et al. | |
| 6,543,110 B1 | 4/2003 | Pelrine et al. | |
| 6,545,384 B1 | 4/2003 | Pelrine et al. | |
| 6,583,533 B2 | 6/2003 | Pelrine et al. | |
| 6,586,859 B2 * | 7/2003 | Kornbluh et al. | 310/309 |
| 6,617,759 B1 | 9/2003 | Zumeris et al. | |

(Continued)

FOREIGN PATENT DOCUMENTS

WO   WO 02/37660 A1   5/2002

(Continued)

OTHER PUBLICATIONS

Kornbluh, R., et al., "Electroactive polymers: An emerging technology for MEMS," (Invited) in *MEMS/MOEMS Components and Their Applications*, eds. S. Janson, W. Siegfried, and A. Henning., Proc. SPIE, 5344:13-27, 2004.

(Continued)

*Primary Examiner*—Walter Benson
*Assistant Examiner*—Bryan P Gordon
(74) *Attorney, Agent, or Firm*—Levine Bagade Han LLP

(57) ABSTRACT

Devices employing electroactive polymer actuators are disclosed. Acrylic dielectric material based actuators are optionally provided in which architectures are presented that allow for improved power output as compared with other known acrylic dielectric material based transducers. Such technology may be applied in motor-driven applications, lightweight flight applications and lighting applications among others.

21 Claims, 28 Drawing Sheets

U.S. PATENT DOCUMENTS

| | | | |
|---|---|---|---|
| 6,628,040 B2 | 9/2003 | Pelrine et al. | |
| 6,664,718 B2 | 12/2003 | Pelrine et al. | |
| 6,707,236 B2 | 3/2004 | Pelrine et al. | |
| 6,768,246 B2 | 7/2004 | Pelrine et al. | |
| 6,781,284 B1 | 8/2004 | Pelrine et al. | |
| 6,806,621 B2 | 10/2004 | Heim et al. | |
| 6,809,462 B2 | 10/2004 | Pelrine et al. | |
| 6,812,624 B1 * | 11/2004 | Pei et al. | 310/309 |
| 6,876,135 B2 | 4/2005 | Pelrine et al. | |
| 6,882,086 B2 | 4/2005 | Kornbluh et al. | |
| 6,891,317 B2 | 5/2005 | Pei et al. | |
| 6,911,764 B2 * | 6/2005 | Pelrine et al. | 310/328 |
| 6,940,211 B2 | 9/2005 | Pelrine et al. | |
| 7,034,432 B1 * | 4/2006 | Pelrine et al. | 310/309 |
| 7,037,270 B2 | 5/2006 | Seward | |
| 7,049,732 B2 | 5/2006 | Pei et al. | |
| 7,052,594 B2 | 5/2006 | Pelrine et al. | |
| 7,062,055 B2 | 6/2006 | Pelrine et al. | |
| 7,064,472 B2 | 6/2006 | Pelrine et al. | |
| 7,144,616 B1 | 12/2006 | Unger et al. | |
| 7,166,953 B2 | 1/2007 | Heim et al. | |
| 7,199,501 B2 | 4/2007 | Pei et al. | |
| 7,211,937 B2 | 5/2007 | Kornbluh et al. | |
| 7,224,106 B2 | 5/2007 | Pei et al. | |
| 7,233,097 B2 | 6/2007 | Rosenthal et al. | |
| 7,237,524 B2 | 7/2007 | Pelrine et al. | |
| 2003/0214199 A1 | 11/2003 | Heim et al. | |
| 2004/0046739 A1 | 3/2004 | Gettemy | |
| 2004/0124738 A1 | 7/2004 | Pelrine et al. | |
| 2005/0085693 A1 * | 4/2005 | Belson et al. | 600/146 |
| 2005/0157893 A1 | 7/2005 | Pelrine et al. | |
| 2005/0206271 A1 | 9/2005 | Higuchi et al. | |
| 2006/0113878 A1 | 6/2006 | Pei et al. | |
| 2006/0113880 A1 * | 6/2006 | Pei et al. | 310/800 |
| 2006/0119225 A1 | 6/2006 | Heim et al. | |
| 2006/0158065 A1 | 7/2006 | Pelrine et al. | |
| 2006/0208609 A1 | 9/2006 | Heim | |
| 2006/0208610 A1 | 9/2006 | Heim | |
| 2006/0238066 A1 | 10/2006 | Pelrine et al. | |
| 2007/0164641 A1 | 7/2007 | Pelrine et al. | |

FOREIGN PATENT DOCUMENTS

| | | |
|---|---|---|
| WO | WO 02/37892 A2 | 5/2002 |
| WO | WO 03/056274 A1 | 7/2003 |
| WO | WO 03/056287 A1 | 7/2003 |
| WO | WO 2004/027970 A1 | 4/2004 |
| WO | WO 2004/053782 A1 | 6/2004 |
| WO | WO 2004/074797 A1 | 9/2004 |
| WO | WO 2004/093763 A1 | 11/2004 |
| WO | WO 2006/102273 A2 | 9/2006 |

OTHER PUBLICATIONS

Kornbluh, R., et al., "Electroelastomers: Applications of dielectric elastomer transducers for actuation, generation and smart structures," *Smart Structures and Materials 2002: Industrial and Commercial Applications of Smart Structures Technologies*, ed., A. McGowan, *Proc. SPIE*, 4698:254-270, 2002.

Kornbluh, R., et al., "Shape control of large lightweight mirrors with dielectric elastomer actuation," Actuation Smart Structures and Materials 2003: Electroactive Polymer Actuators and Devices, ed. Y. Bar-Cohen, Proc. SPIE, 5051, 2003.

Pelrine, R., et al., "Applications of dielectric elastomer actuators," (invited paper) in *Smart Structures and Materials 2001: Electroactive Polymer Actuators and Devices*, ed., Y. Bar Cohen, *Proc. SPIE*, 4329:335-349, 2001.

* cited by examiner

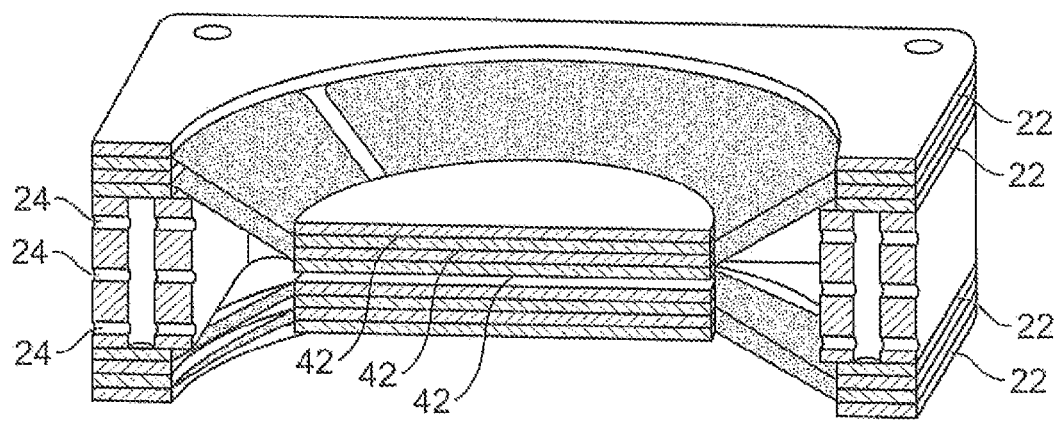
FIG. 10
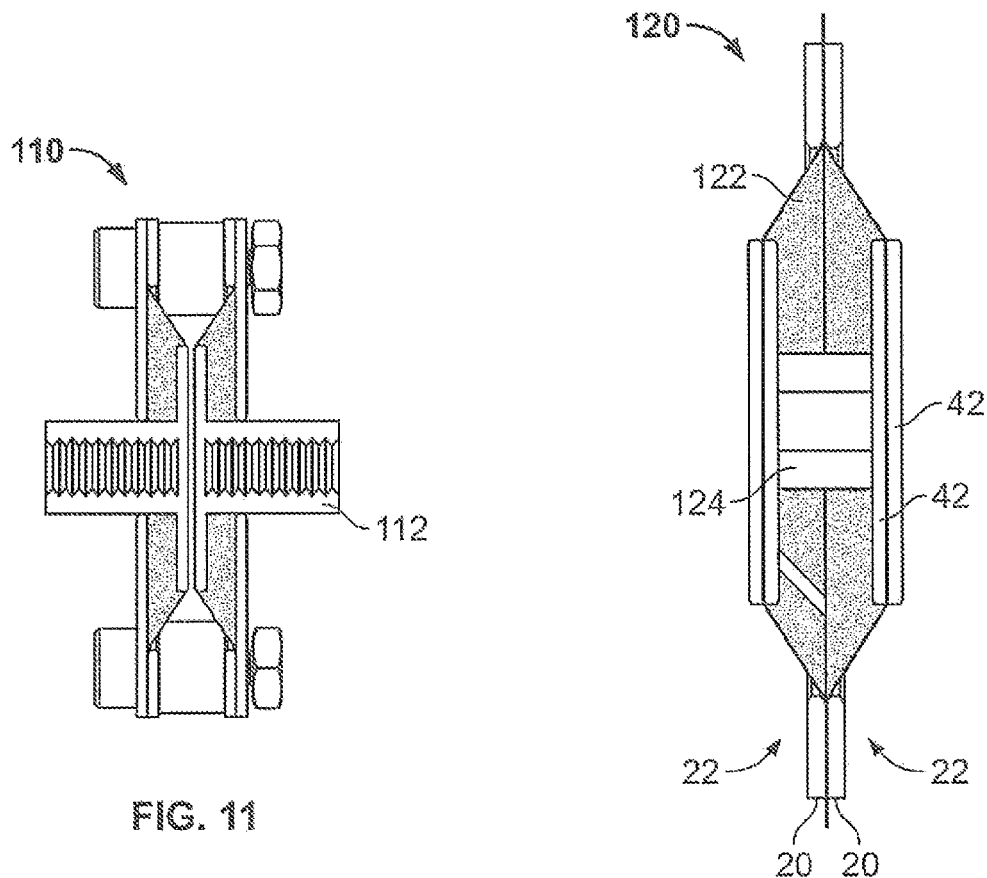
FIG. 11
FIG. 12

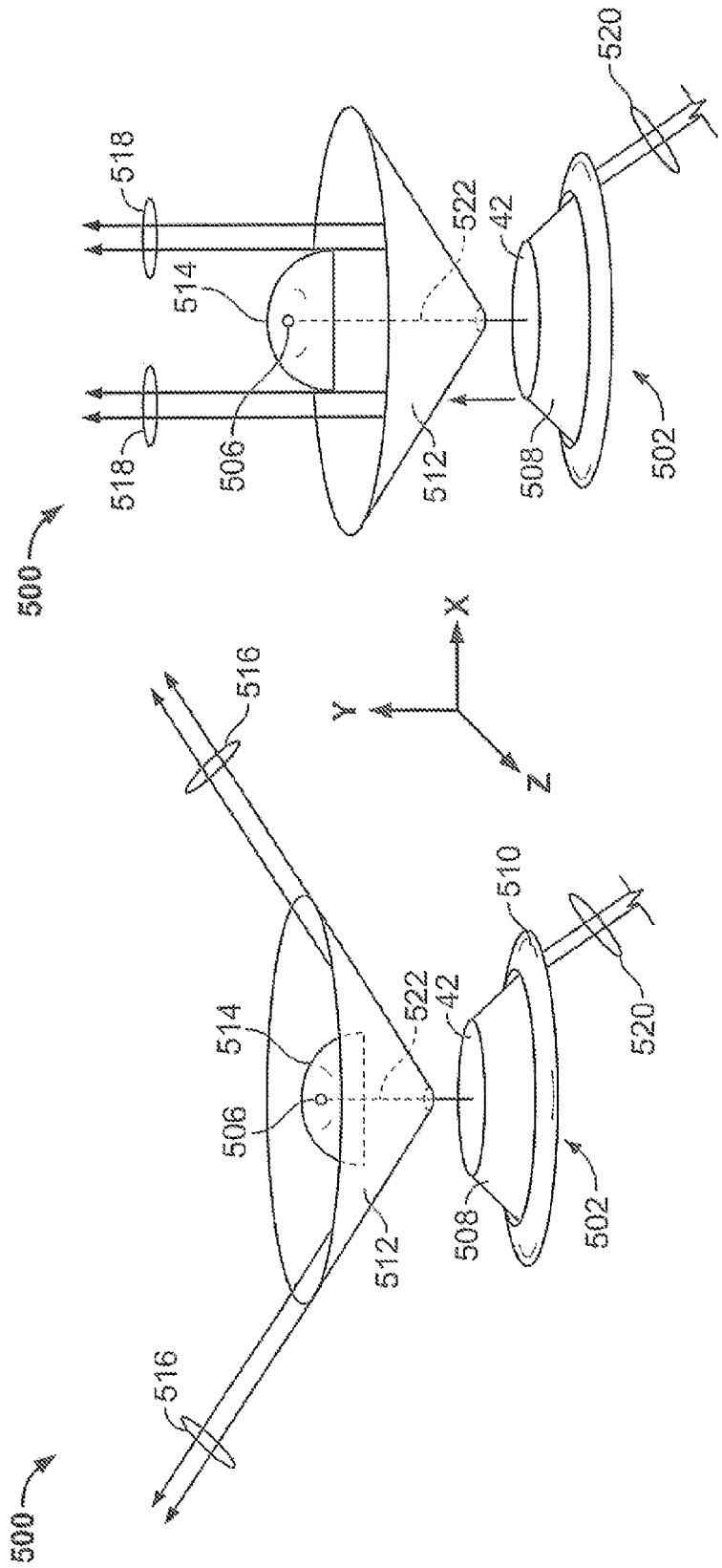

THREE-DIMENSIONAL ELECTROACTIVE POLYMER ACTUATED DEVICES

CROSS-REFERENCE

This application is a continuation-in-part of U.S. patent application Ser. No. 11/085,798, entitled, "Electroactive Polymer Actuated Devices," filed Mar. 21, 2005, and is a continuation-in-part of U.S. patent application Ser. No. 11/085,804, entitled "High-Performance Electroactive Polymer Transducers," filed Mar. 21, 2005, the contents of which are incorporated herein by reference in their entirety.

BACKGROUND

A tremendous variety of devices used today rely on actuators of one sort or another to convert electrical energy to mechanical energy. The actuators "give life" to these products, putting them in motion. Conversely, many power generation applications operate by converting mechanical action into electrical energy. Employed to harvest mechanical energy in this fashion, the same type of actuator may be referred to as a generator. Likewise, when the structure is employed to convert physical stimulus such as vibration or pressure into an electrical signal for measurement purposes, it may be referred to as a transducer. Yet, the term "transducer" may be used to generically refer to any of the devices. By any name, a new class of components employing electroactive polymers can be configured to serve these functions.

Especially for actuator and generator applications, a number of design considerations favor the selection and use of advanced electroactive polymer technology based transducers. These considerations include potential force, power density, power conversion/consumption, size, weight, cost, response time, duty cycle, service requirements, environmental impact, etc. Electroactive Polymer Artificial Muscle (EPAM™) technology developed by SRI International and licensee Artificial Muscle, Inc. excels in each of these categories relative to other available technologies. In many applications, EPAM™ technology offers an ideal replacement for piezoelectric, shape-memory alloy (SMA) and electromagnetic devices such as motors and solenoids.

As an actuator, EPAM™ technology operates by application of a voltage across two thin elastic film electrodes separated by an elastic dielectric polymer. When a voltage difference is applied to the electrodes, the oppositely-charged members attract each other producing pressure upon the polymer therebetween. The pressure pulls the electrodes together, causing the dielectric polymer film to become thinner (the z-axis component shrinks) as it expands in the planar directions (the x and y axes of the polymer film grow). Another factor drives the thinning and expansion of the polymer film. The like (same) charge distributed across each elastic film electrode causes the conductive particles embedded within the film to repel one another expanding the elastic electrodes and dielectric attached polymer film.

Using this "shape-shifting" technology, Artificial Muscle, Inc. is developing a family of new solid-state devices for use in a wide variety of industrial, medical, consumer, and electronics applications. Current product architectures include: actuators, motors, transducers/sensors, pumps, and generators. Actuators are enabled by the action discussed above. Generators and sensors are enabled by virtue of changing capacitance upon physical deformation of the material.

Artificial Muscle, Inc. has introduced a number of fundamental "turnkey" type devices that can be used as building blocks to replace existing devices. Each of the devices employs a support or frame structure to pre-strain the dielectric polymer. It has been observed that the pre-strain improves the dielectric strength of the polymer, thereby offering improvement for conversion between electrical and mechanical energy by allowing higher field potentials.

Of these actuators, "Spring Roll" type linear actuators are prepared by wrapping layers of EPAM™ material around a helical spring. The EPAM™ material is connected to caps/covers at the ends of the spring to secure its position. The body of the spring supports a radial or circumferential pre-strain on the EPAM™ while lengthwise compression of the spring offers axial pre-strain. Voltage applied causes the film to squeeze down in thickness and relax lengthwise, allowing the spring (hence, the entire device) to expand. By forming electrodes to create two or more individually addressed sections around the circumference, electrically activating one such section causes the roll to extend and the entire structure to bend away from that side.

Bending beam actuators are formed by affixing one or more layers of stretched EPAM™ material along the surface of a beam. As voltage is applied, the EPAM™ material shrinks in thickness and grows in length. The growth in length along one side of the beam causes the beam to bend away from the activated layer(s).

Pairs of dielectric elastomer films (or complete actuator packages such as the aforementioned "spring rolls") can be arranged in "push-pull" configurations. Switching voltage from one actuator to another shifts the position of the assembly back and forth. Activating opposite sides of the system makes the assembly rigid at a neutral point. So-configured, the actuators act like the opposing bicep and triceps muscles that control movements of the human arm. Whether the push-pull structure comprises film sections secured to a flat frame or one or more opposing spring rolls, etc, one EPAM™ structure can then be used as the biasing member for the other and vice versa.

Another class of devices situates one or more film sections in a closed linkage or spring-hinge frame structure. When a linkage frame is employed, a biasing spring may generally be employed to pre-strain the EPAM™ film. A spring-hinge structure may inherently include the requisite biasing. In any case, the application of voltage will alter the frame or linkage configuration, thereby providing the mechanical output desired.

Diaphragm actuators are made by stretching EPAM™ film over an opening in a rigid frame. Known diaphragm actuator examples are biased (i.e., pushed in/out or up/down) directly by a spring, by an intermediate rod or plunger set between a spring and EPAM™, by resilient foam or air pressure. Biasing insures that the diaphragm will move in the direction of the bias upon electrode activation/thickness contraction rather than simply wrinkling. Diaphragm actuators can displace volume, making them suitable for use as pumps or loudspeakers, etc.

More complex actuators can also be constructed. "Inchworm" and rotary output type devices are examples of such. Further description and details regarding the above-referenced devices as well as others may be found in the following patents and/or patent application publications:

U.S. Pat. No. 6,940,221 Electroactive polymer transducers and actuators

U.S. Pat. No. 6,911,764 Energy Efficient Electroactive Polymers and Electroactive Polymer Devices U.S. Pat. No. 6,891,317 Rolled Electroactive Polymers U.S. Pat. No. 6,882,086 Variable Stiffness Electroactive Polymer Systems U.S. Pat. No. 6,876,135 Master/slave Electroactive Polymer Systems
U.S. Pat. No. 6,812,624 Electroactive polymers
U.S. Pat. No. 6,809,462 Electroactive polymer sensors
U.S. Pat. No. 6,806,621 Electroactive polymer rotary motors
U.S. Pat. No. 6,781,284 Electroactive polymer transducers and actuators
U.S. Pat. No. 6,768,246 Biologically powered electroactive polymer generators
U.S. Pat. No. 6,707,236 Non-contact electroactive polymer electrodes
U.S. Pat. No. 6,664,718 Monolithic electroactive polymers
U.S. Pat. No. 6,628,040 Electroactive polymer thermal electric generators
U.S. Pat. No. 6,586,859 Electroactive polymer animated devices
U.S. Pat. No. 6,583,533 Electroactive polymer electrodes
U.S. Pat. No. 6,545,384 Electroactive polymer devices
U.S. Pat. No. 6,543,110 Electroactive polymer fabrication
U.S. Pat. No. 6,376,971 Electroactive polymer electrodes
U.S. Pat. No. 6,343,129 Elastomeric dielectric polymer film sonic actuator
2006/0000214 Compliant walled combustion devices
2005/0157893 Surface deformation electroactive polymer transducers
20040263028 Electroactive polymers
20040217671 Rolled electroactive polymers
20040124738 Electroactive polymer thermal electric generators
20040046739 Pliable device navigation method and apparatus
20040008853 Electroactive polymer devices for moving fluid
20030214199 Electroactive polymer devices for controlling fluid flow
20020175598 Electroactive polymer rotary clutch motors
20020122561 Elastomeric dielectric polymer film sonic actuator Each of these documents is incorporated herein by reference in its entirety for the purpose of providing background and/or further detail regarding underlying technology and features as may be used in connection with or in combination with the aspects of present invention set forth herein.

While the devices described above provide highly functional examples of EPAM™ technology transducers, there continues to be an interest in developing high performance EPAM™ transducers. One limitation of know actuators has been tied to the elastic dielectric material selected for use.

Specifically, a number of advantages have been documented with respect to use of acrylic polymer for the dielectric material. It is commercially available in sheet form, and offers tremendous strain rates. As for the latter consideration, this allows for high pre-strain on the material, thereby providing the dual benefits of thinner dielectric layers and strain-induced alignment of the material resulting in generally improved dielectric performance.

However, prior extensive testing has lead those with skill in the art to believe that acrylic-based EPAM™ actuators are limited in performance such that work output drops significantly above about 100 Hz rates of actuation. Furthermore, the material is believed to limit speed response in unknown ways. See, Bar-Cohen, Yoseph, *Electroactive Polymer (EAP) Actuators as Artificial Muscles: Reality, Potential, and Challenges Second Edition*. Chapter 16.3.3, SPIE Press, March 2004. Overcoming the former misconception, and rendering the latter moot, transducers according to the present invention offer power output previously believed to be impossible from acrylic dielectric material based transducers.

SUMMARY OF THE INVENTION

Transducers according to the present invention offer improved power output as compared with other acrylic dielectric material based transducers. Various transducer configurations are described that are unique in their ability to be tuned for high-frequency applications, even though acrylic polymer is used for the dielectric material. Only through appreciation of the teachings herein would one be motivated to attempt such tuning, as prior authority has taught away from such possibility.

According to the present invention, it has been determined that one class of EPAM™ transducers can be run or "clocked" at high rates (e.g., at or above 50 Hz, more typically up to 100 Hz, and even up to about 1 KHz) without detrimental decrease in output stroke relative to typically lower speed DC switched applications. In other words, even at higher frequencies, the theoretical performance of such systems substantially matches actual performance (i.e., driven at higher frequencies, the selected transducers essentially offer performance at their theoretical limit).

This class of transducers includes those in which the EPAM™ is substantially unconstrained from compression to yield device output. In other words, multiple direction components of extension or growth of the material contributes to device output. With such architecture, one or more mass elements are employed so as to provide a spring-mass or spring-mass-damper system which operates at or near a resonance at a desirably high frequency.

The value of high frequency operation is to increase overall device power output. When operating at or near a natural resonance frequency, output stroke is maximized (or at least improved relative to a condition far departed from the resonance peak). Added to this is that the higher the frequency, the more working cycles offered. As such, the assignee hereof has produced pumps offering 10× performance improvement. Further advancement is possible as well.

Regarding the physical characteristics of the actuators, in one variation, frustum-shaped diaphragm actuators are provided in which the top of the structure includes a cap. The cap may be a solid disc, annular member or otherwise constructed. The cap provides a stable interface between opposing frustums and/or for a mechanical preloaded element such as a spring. Such structures are further described below. In addition to such teachings, according to the present invention, the mass of the cap is set in order to provide a system that operates at resonance or has a band of operation near resonance delivering desired performance at desirably high frequencies.

In operation, compression of the EPAM™ material causes growth around the cap such that it is displaced by the preload applied to the system in a direction with at least a component perpendicular to the device frame. In another application, no preload is employed, but rather an inertial load of the mass provides for system return during oscillation.

In pump applications, the actuator cap and device diaphragm may be one in the same, thereby integrating the subassemblies. Other applications are possible as well. An example of which is provided below.

As for other acrylic actuator architectures applicable to high-speed use, some examples are know—though never appreciated as offering such application. Specifically, U.S. Pat. No. 6,545,384 describes planar devices in which a plurality of struts surrounding EPAM™ material hinge or flex relative to one another to change configuration to yield device mechanical output and/or accept mechanical input to convert to electrical output in a generator configuration. As an actuator, compression of the EPAM™ upon voltage application causes growth in a different direction of a plane defined by a stretched electroactive polymer material diaphragm. As actuators, because these devices efficiently use the mutlidirectional expansion of the EPAM™, they are amendable to high-frequency tuning according to the present invention. Such use is accomplished by tuning the mass of the strut/frame segments or another mass element coupled to output features.

In contrast, it is a theory of the inventors hereof that other actuator types employing acrylic polymer in the EPAM™ material are not amenable to such use due to inefficient use of the polymer. In less efficient structures, such as "spring roll" and deflectable beam and planar actuators (the latter described with respect to FIG. 3 below), material is not used to drive action (or capture energy) with each available direction of material expansion/contraction. Rather, internal losses compounded by the acrylic's naturally high hysteresis in such actuators are believed to account for the prior belief by those with skill in the art that acrylic-based actuator could not perform as presently taught.

In any case, another variation of the invention offers yet another actuator architecture suitable for acrylic polymer based high-frequency use. In this variation, a unitary flexible frame is provided that flexes to change its 3-dimensional orientation (in contrast to the 2-dimensionally constrained or planar actuators described directly above). Even when not driven at higher frequencies, the architecture may offer particular efficiency in energy output. Still further, its unique configuration, resembling "flapping" wings when actuated (on one side of an equilibrium point or through a full range past a bi-stable equilibrium point), offers an advantageous actuator for driving animal-like wings.

Especially for high-frequency applications, actuator variations according to the invention are advantageously applied to new rotary motor configurations described below. The drive members of the subject motors may be configured to optimize performance for a particular application depending on energy and speed requirements and the number of drive members involved.

Whether driven by a high-frequency acrylic based transducer or a high-frequency silicone based transducer, in certain embodiments, the motors may be configured to offer a manual-override control feature. Stated otherwise, a new rotary motor architecture is disclosed that may be set-up for intermittent engagement of drive members in order to offer manual adjustment when drive components are inactive. Such a-device may be employed in low-flow dispensing applications for infusion, perfusion, etc. in which manual intervention to alter flow levels is either desirable or necessary for efficacy and/or safety.

In addition to the various actuator applications involving a purely mechanical output, the EPAM™ actuators of the present invention may be applied in various lighting applications. Any number of actuators may be employed to provide actuation to a plurality of reflectors and/or lenses such that the relative motion between a light source and the reflector/lens assembly creates a variable-angle light reflector. The reflector assembly is configured such that the resultant reflected light ray is made up of all available light provided by the light source. By scanning this light over a surface or in a direction at a high rate of oscillation beyond human perception (>60 Hz), the result is a field of specific intensity and design based on the actuation level of the EPAM device and the specific design of the reflector system. This system can also be employed in a deliberately stroboscopic manner to increase the ability of the light to be picked up by the human eye. Such a system may be employed in standard lighting applications driven by 120V AC outlet power as well as in mobile lighting applications, such as in any self-propelled vehicle (automobiles, planes, ships), flash lights, etc.

Regarding methodology, the subject methods may include each of the mechanical activities associated with use of the devices describe as well as electrical activity. As such, methodology implicit to the use of the devices described forms part of the invention. Such methodology may include that associated with running acrylic based EPAM™ transducers as motors or generators at higher frequencies or power output/generation levels that currently believed possible. The methods may focus on design or manufacture of such devices. In other methods, the various acts of mechanical actuation are considered; in still others, the power profiles, monitoring of power and other aspects of power control are considered. Likewise, electrical hardware and/or software control and power supplies adapted by such means (or otherwise) to effect the methods form part of the present invention.

BRIEF DESCRIPTION OF THE DRAWINGS

The figures illustrate exemplary aspects of the invention. Of these figures:

FIG. 10 is a sectional perspective view of a parallel-stacked type of frustum transducer;

FIG. 11 is a side-section view showing an optional output shaft arrangement with a frustum type transducer;

FIG. 12 is a side-section view of an alternate, inverted frustum transducer configuration;

FIG. 25B shows a time-lapse view of actual use;

FIGS. 26A and 26B provide a schematic illustration of one embodiment of a lighting system employing a frustum-type actuator of the present invention;

Variation of the invention from that shown in the figures is contemplated.

DETAILED DESCRIPTION OF THE INVENTION

Various exemplary embodiments of the invention are described below. A number of actuator/transducer embodiments are first described. Next, systems optionally incorporating such devices are described. They are provided to illustrate broadly applicable aspects of the present invention.

Frustum Transducers

Figure 1A:
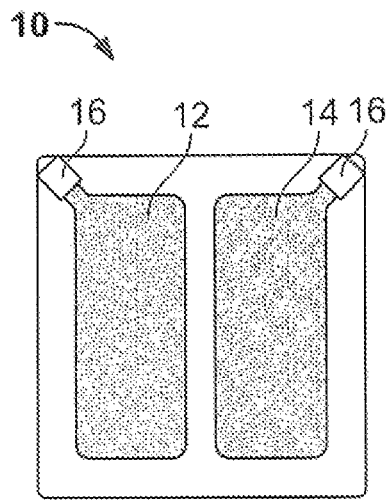
FIGS. 1A and 1B show opposite sides of an EPAM™ layer.
Figure 1B:
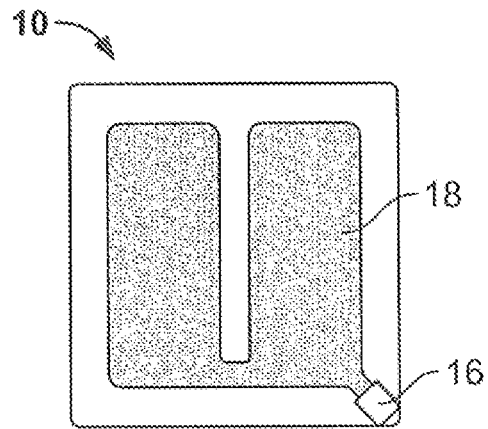

FIGS. 1A and 1B show opposite sides of an EPAM™ layer 10. The layer comprises dielectric polymer sandwiched between elastic thin film electrodes. FIG. 1A shows the side of the layer patterned with "hot" electrodes 12 and 14. Each electrode is connected to a lead 16. FIG. 1B shows the opposite side of layer 10 patterned with a common "ground" electrode 18 connected to a single lead 16.

Figure 2:
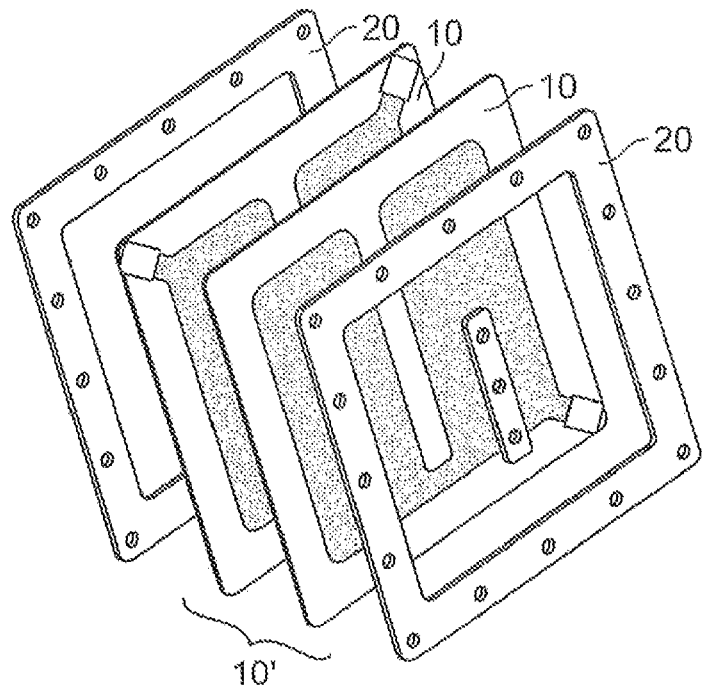
FIG. 2 is an assembly view of an EPAM™ layer stack.

As shown in FIG. 2, multiple film layers 10 are stacked and held in a stretched state within frame pieces 20. A number of individual EPAM™ layers 10 are advantageously stacked to form a compound layer 10'. Doing so amplifies the force potential of the system. The number of layers stacked may range from 2 to 10 or more. Generally, it will be desired to stack an even number of layers so that ground electrodes are facing any exposed surfaces to provide maximum safety. In any case, the EPAM™ layer or layers may collectively be referred to as EPAM™ "film".

Figure 3:
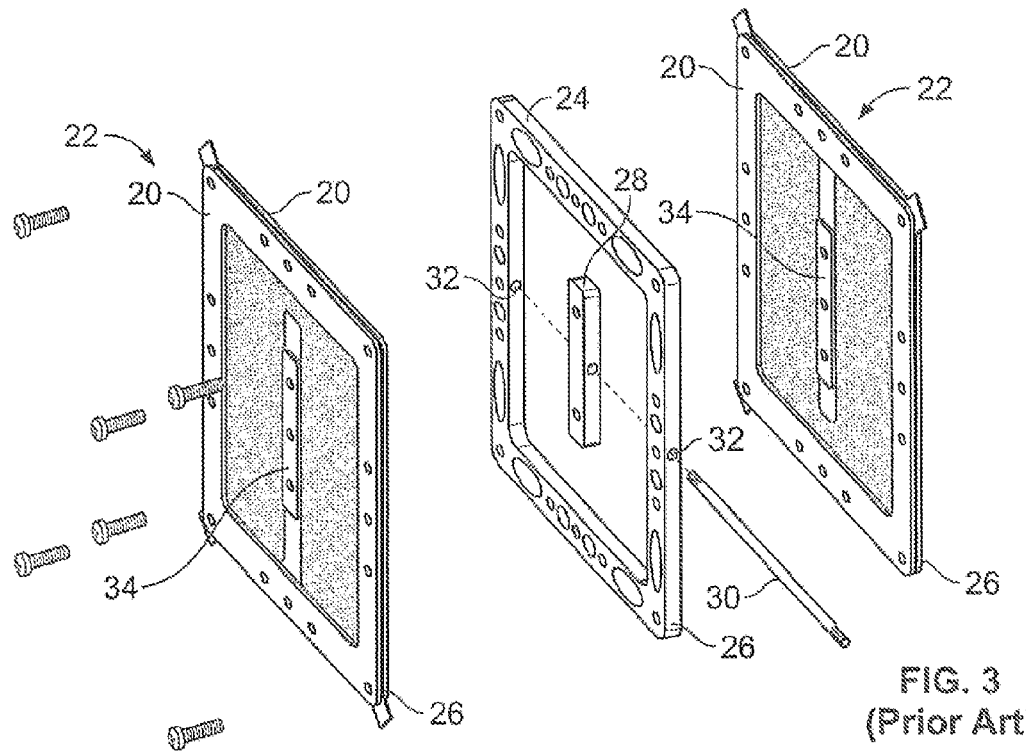
FIG. 3 is an assembly view of an EPAM™ planar actuator.

With one or more layers of material secured in a frame, the frame may be used to construct a complex transducer mechanism. FIG. 3 shows one such construction as known in the art.

Here, individual cartridge sections 22 are secured to a secondary or body frame portion 24. Any film frames and intermediate frame member are joined to provided a combined (i.e., attached with fasteners as shown, bonded together, etc.) frame structure 26. A spacer 28 provides an interface for an input/output rod 30 received by the frame through guide hole 32. The spacer is attached to the film via complementary mounts 34 bonded to or clamped the EPAM™ film with the spacer.

To actuate a device constructed according to FIG. 3, voltage is applied to either one of electrodes 12 or 14. By applying voltage to one side, that side expands, while the other relaxes its preload and contracts.

Figure 4A:
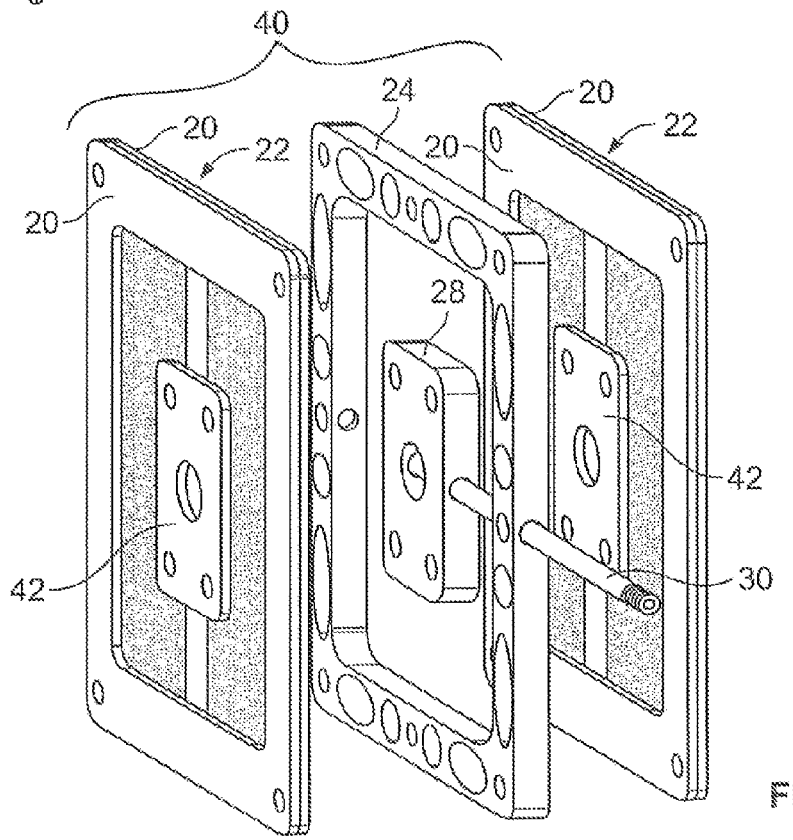
FIGS. 4A and 4B are assembly and perspective views, respectively, of a planar transducer configuration.
Figure 4B:
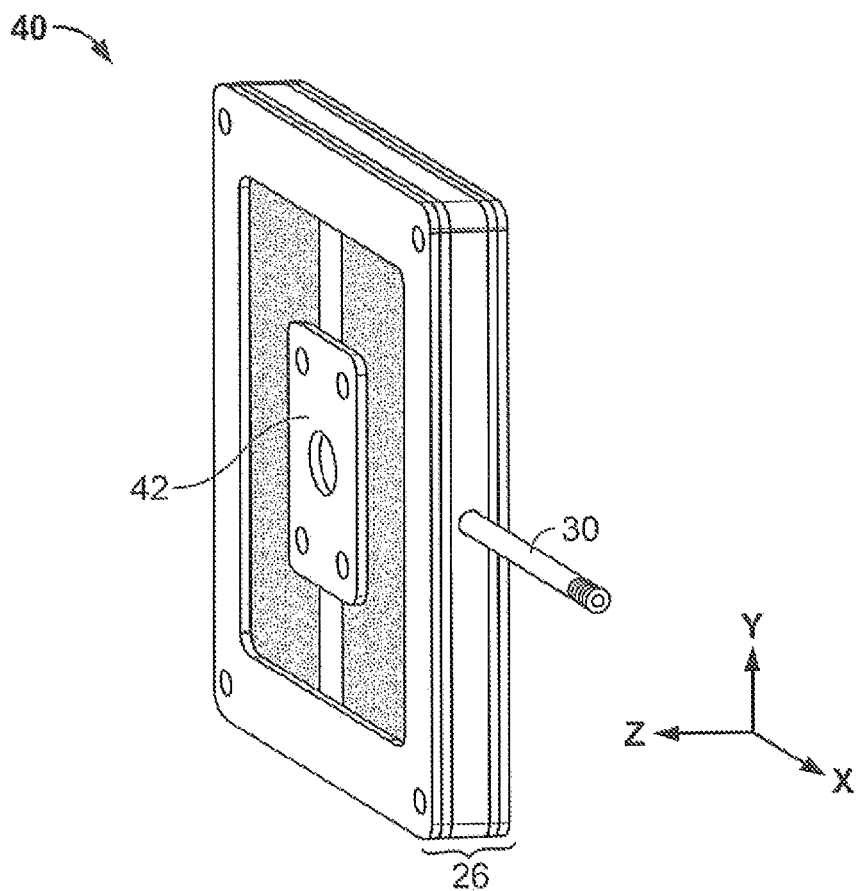

A first device capable of alternatively being set in a frustum architecture can be similarly configured and operated. FIGS. 4A and 4B provide assembly and perspective view of a transducer 40 that can alternatively be configured for planar actuation (as the device is in FIG. 3) and out-of-plane actuation. As with the device described in reference to the previous figures, frames 20 carry layers 10/10' with ground electrodes facing outward.

Again, individual cartridge sections 22 are stacked with a secondary frame 24 and spacer 28 therebetween, with the spacer providing an interface for an input/output rod 30 received by the frame. However, spacer 28 in this configuration is to be attached to the substantially square-shaped cap 42 elements of cartridges 22. A more symmetrical interface portion offers advantages as will be explained below. FIG. 4B shows the assembled device. Here, transducer 40 is shown as a complete unit.

Figure 5:
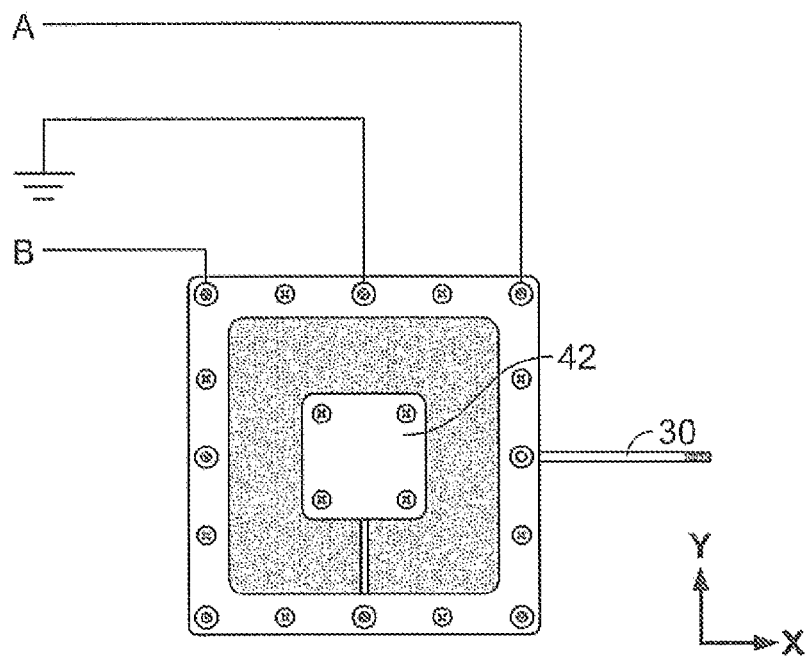
FIG. 5 is a top view of a the device in FIGS. 4A and 4B electrically connected for planar actuation.

As for actuation of the device, FIG. 5 shows a basic circuit diagram in which "A" and "B" sides of the circuit are powered relative to ground to cause back and forth movement of rod 30 along an X-axis relative to frame.

Figure 6A:
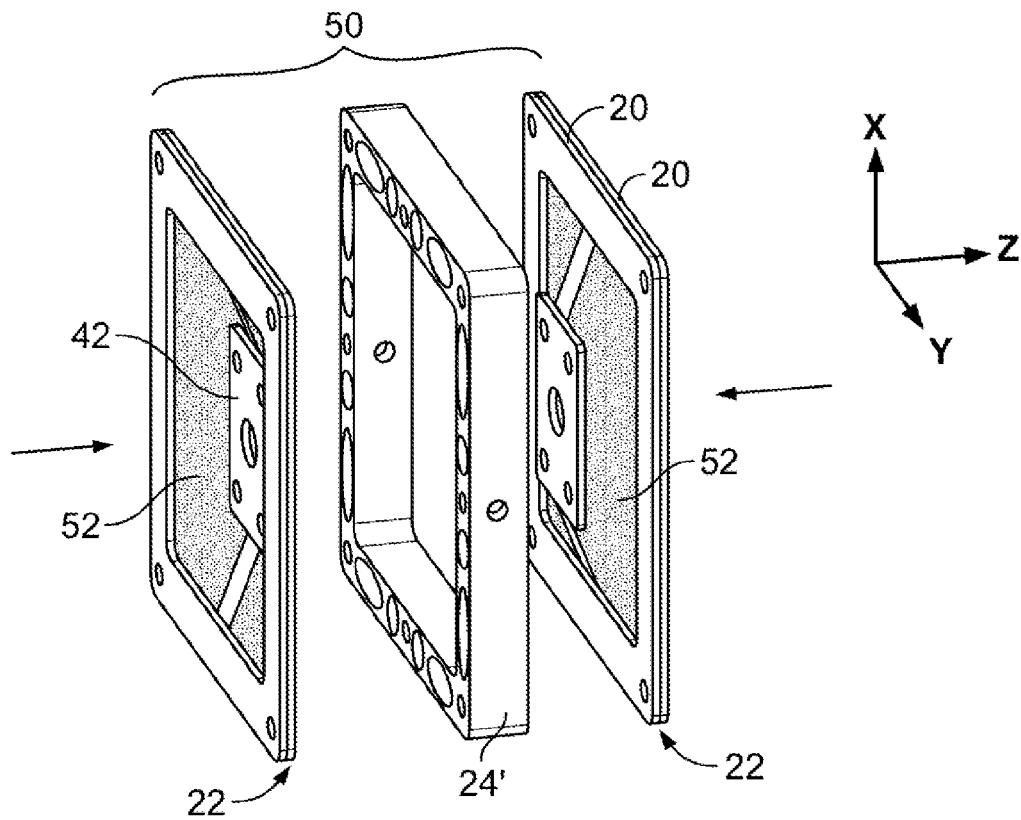
FIGS. 6A and 6B are assembly and perspective views, respectively, of the transducer in FIGS. 4A and 4B setup in an alternate, frustum configuration for out-of-plane actuation.
Figure 6B:
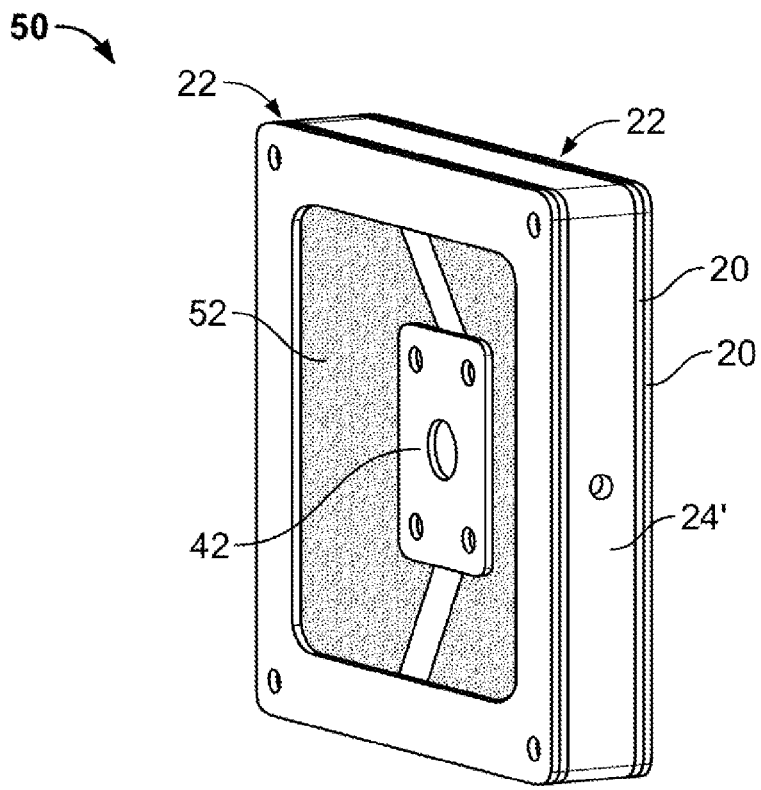

In the alternative configuration alluded to above, the same EPAM™ layer cartridges can be used to produce a transducer adapted for out-of-plane or Z-axis input/output. FIGS. 6A and 6B illustrate such a device. Here transducer assembly 50 may employ a thicker body frame 24'. By employing such a frame and also omitting the spacer layer, when caps 42 are secured to one another, they produce deeply concave diaphragms 52 facing opposite or away from one another. To actuate the transducer for simple Z-axis motion, one of the concave/frustum sides is expanded by applying voltage while the other side is allowed to relax. Such action increases the depth of one cavity 52 while decreasing that of the other. In the simplest case, the motion produced is generally perpendicular to a face of the caps 42.

Figure 7A:
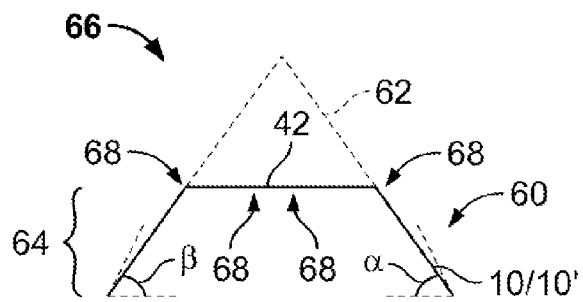
FIGS. 7A-7C diagrammatically illustrate the geometry and operation of frustum-shaped actuators.
Figure 7B:
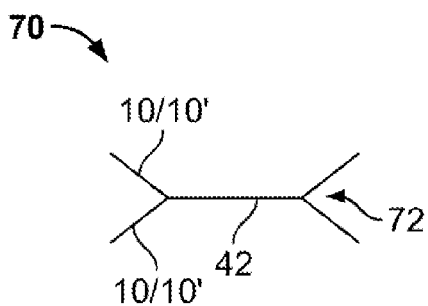
Figure 7C:
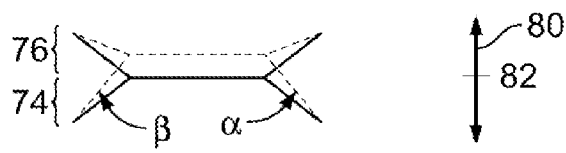

FIGS. 7A-7C diagrammatically illustrate the manner in which these concave/convex or frustum shaped actuators function in a simplified two dimensional model. FIG. 7A illustrates the derivation of the transducer frustum shape.

A "frustum" is technically the portion of a geometric solid that lies between two parallel planes. A frustum is often regarded as the basal part of a cone or pyramid formed by cutting off the top by a plane, typically, parallel to the base. Naturally, frustum-type actuators according to the invention may be in the form of a truncated cone, thereby having a circular cross-section, or may employ a variety of cross-sectional configurations. Depending on their application, desirable alternative cross-sectional geometries include triangular, square, pentagonal, hexagonal, etc. Often, symmetrically shaped members will be desirable from the perspective of consistent material performance. However, ovaloid, oblong, rectangular or other shapes may prove better for a given application—especially those that are space-constrained. Further variation of the subject "frustum" transducers is contemplated in that the top and/or bottom of the form(s) need not be flat or planer, nor must they be parallel. In a most general sense, the "frustum" shape employed in the present invention may be regarded as a body of volume that is truncated or capped at an end. Often, this end is the one having the smaller diameter or cross-sectional area.

Whether conical, squared, ovaloid, or otherwise when viewed from above or from the side, a truncated form 60 is provided. It may formed through modifying existing diaphragm actuator configurations by capping the top (or bottom) of the structure. When under tension, the cap 42 alters the shape the EPAM™ layer/layers 10/10' would take. In the example where a point load stretches the film, the film would assume a conical shape (as indicated by dashed lines define a triangular top 62). However, when capped or altered to form a more rigid top structure, the geometry is truncated as indicated in solid lines 64 in FIG. 7A.

So-modified, the structure's performance is fundamentally altered. For one, the modification distributes stress that would otherwise concentrate at the center of structure 66 around a periphery 68 of the body instead. In order to effect this force distribution, the cap 42 is affixed to the EPAM™ layers. An adhesive bond may be employed. Alternatively, the constituent pieces may be bonded together using any viable technique such as thermal bonding, friction welding, ultrasonic welding, or the constituent pieces may be mechanically locked or clamped together. Furthermore, the capping structure may comprise a portion of the film which is made substantially more rigid through thermal, mechanical or chemical techniques—such as vulcanizing.

Generally, the cap section will be sized to produce a perimeter of sufficient dimension/length to adequately distribute stress applied to the material. The ratio of the size of the cap to the diameter of the frame holding the EPAM™ layers may vary. Clearly, the size of the disc, square, etc. employed for the cap will be larger under higher stress/force application. The degree of truncation of the structure is of further importance to reduce the aggregate volume or space that the transducer occupies in use, for a given amount of pre-stretch to the EPAM™ layers as compared to point-loaded diaphragm material cones, pressure biased domes, etc. Furthermore, in a frustum type diaphragm actuator, the cap or diaphragm element 42 may serve as an active component (such as a valve seat, etc.) in a given system.

With the more rigid or substantially rigid cap section formed or set in place, when EPAM™ material housed by a frame is stretched in a direction perpendicular to the cap (as seen by comparing the EPAM/frame configurations as shown in FIGS. 6A/6B), it produces the truncated form. Otherwise the EPAM™ film remains substantially flat or planar.

Returning to FIG. 7A, with the cap 42 defining a stable top/bottom surface, the attached EPAM™ polymer sides 10/10' of the structure assume an angle with respect to the cartridge frame (not shown in FIGS. 7A-7C). When the EPAM™ is not activated, the angle α may range between about 15 and about 85 degrees. More typically it will range from about 30 to about 60 degrees. When voltage is applied so that the EPAM™ material is compressed and grows in its planar dimensions, it assumes a second angle β in about the same range plus between about 5 and about 15 degrees. Optimum angles may be determined based on application specifications.

Single-sided frustum transducers are within the contemplated scope of the present invention as well as double-sided structures. For preload, single-sided devices employ any of a spring interfacing with the cap (e.g., a coil, a constant force or roll spring, leaf spring. etc.), air or fluid pressure, magnetic attraction, a weight (so that gravity provides preload to the system), or a combination of any of these means or the like. In yet another variation, a mass is provided such that in a cyclic application, the mass is tuned to offer an inertial bias. The mass of the system will be tuned so as to offer maximum displacement at a desired frequency of operation. Ideally, when a constant operating frequency can be employed, the size of the mass is selected for resonance by modeling the system as a mass-spring system or mass-spring-damper mechanical system. In variable frequency applications, system may be designed so that the peak performance range covers a broader section of frequencies, e.g. from about 0.1 to about 300 Hz.

In double-sided frustum transducers, one side typically provides preload to the other. Still, such devices may include additional bias features/members. FIG. 7B illustrates the basic "double-frustum" architecture 70. Here, opposing layers of EPAM™ material or one side of EPAM™ film and one side of basic elastic polymer are held together under tension along an interface section 72. The interface section often comprises one or more rigid or semi-rigid cap element(s) 42. However, by adhering two layers of the polymer together at their interface, the combined region of material, alone, offers a relatively stiffer or less flexible cap region as required of this class of actuator.

However constructed, the double-frustum transducer operates as shown in FIG. 7B. When one film side 74 is energized, it relaxes and pulls with less force, releasing stored elastic energy in the bias side 74 and doing work through force and stroke. Such action is indicated by dashed line in FIG. 7B. If both film elements comprise EPAM™ film, then the actuator can move in/out or up/down relative to a neutral position (shown by solid line in each of FIGS. 7A and 7B) as indicated by double-headed arrow 80.

If only one active side 74/76 is provided, forced motion is limited to one side of neutral position 82. In which case, the non-active side of the device may simply comprise elastic polymer to provide preload/bias (as mentioned above) or EPAM™ material that is connected electrically to sense change in capacitance only or to serve as a generator to recover motion or vibration input in the device in a regenerative capacity.

Figure 8:
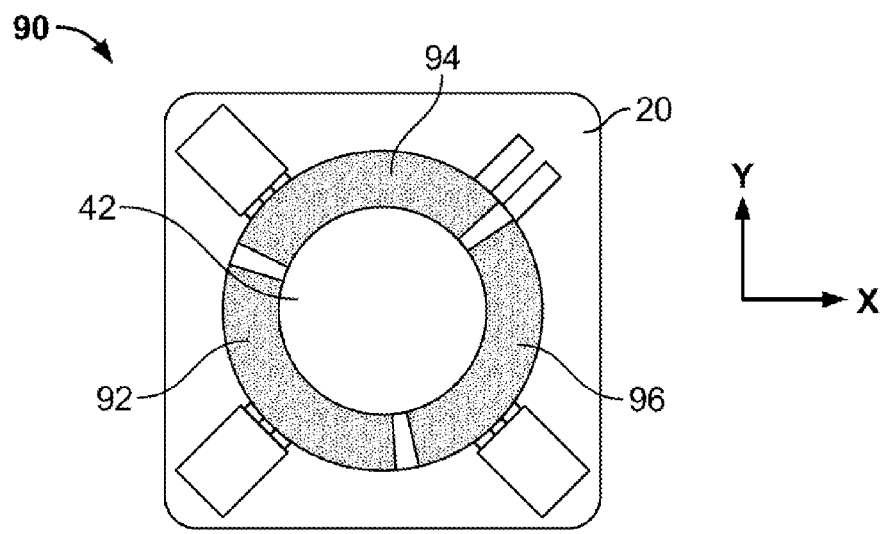
FIG. 8 is a top view of a multi-phase frustum-shaped actuator.

Further optional variation for frustum transducers includes provision for multi-angle/axis sensing or actuation. FIG. 8 shows a circular EPAM™ cartridge 90 configuration with three (92, 94, 96) independently addressable zones or phases. When configured as an actuator, by differential voltage application, the sections will expand differently causing cap 42 to tilt on an angle. Such a multi-phase device can provide multi-directional tilt as well as translation depending on the manner of control. When configured for sensing, input form a rod or other fastener or attachment to the cap causing angular deflection can be measured by way of material capacitance change.

Figure 9A:
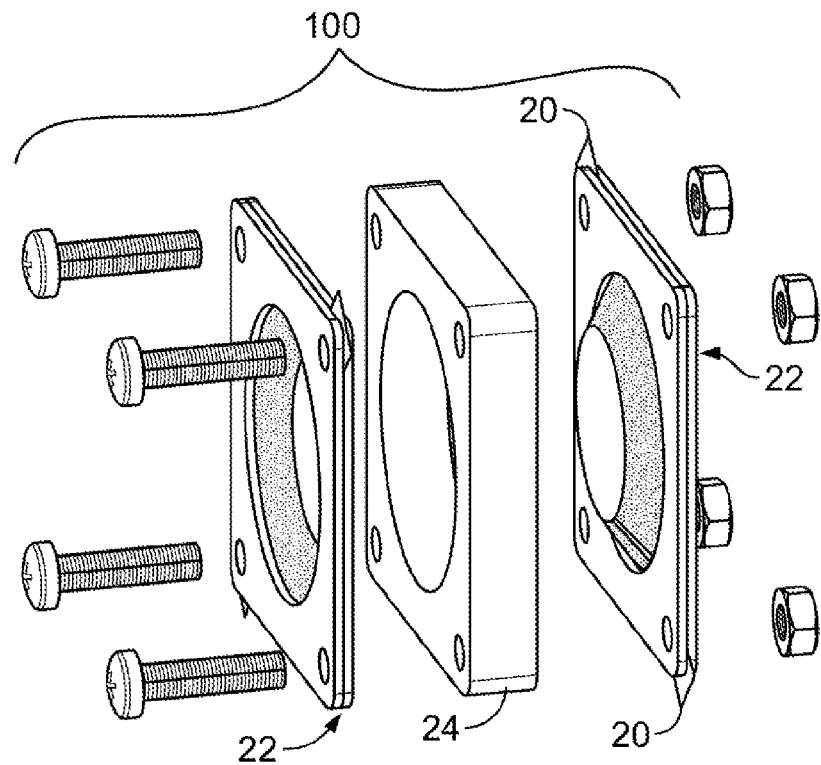
FIG. 9A is an assembly view of another frustum shaped actuator.
Figure 9B:
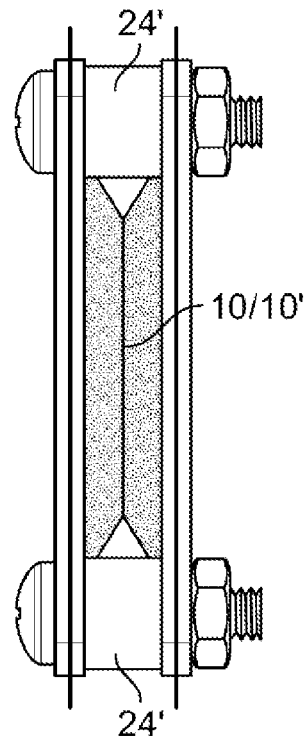
FIG. 9B is a side view of the same basic actuator with an alternate fame construction.

FIG. 9A provides an assembly view of a round-frustum transducer 100. The body frame member 24 employed is solid, resembling that used in the combination or convertible type actuator shown in FIGS. 4A-6B above. However, the device shown in FIG. 9A is a dedicated diaphragm type actuator (though it may employ a multi-phase structure shown in FIG. 8.) An alternative construction for such an actuator is shown in FIG. 9B. Here, the monolithic frame element 24 is replaced by simple stand-off type frame spacers 24'.

FIG. 10 shows another construction variation in which the transducer comprises multiple cartridge layers 22 on each side of a double-frustum device 100. Individual caps 42 are ganged or stacked together. To accommodate the increased thickness, multiple frame' sections 24 may likewise be stacked upon one another. Also, as previously mentioned, each cartridge 22 may employ compound EPAM™ layers 10'. Either one or both approaches together—may be employed to increase the output potential of the subject device. Alternatively, at least one cartridge member in the form of the stack (on either one or both sides of the device) may be setup for sensing—as opposed to actuation—to facilitate active actuator control or operation verification. Regarding such control, any type of feedback approach such as a PI or PID controller may be employed in the system to control actuator position with very high accuracy and/or precision.

FIG. 11 is a side-sectional view showing an optional output shaft arrangement with a frustum type transducer 110. Threaded bosses 112 on either side of the cap pieces provide a means of connection for mechanical output as shown. The bosses may be separate elements attached to the cap(s) or may be formed integral therewith. Even though an internal thread arrangement is shown, an external threaded shaft may be employed. Such an arrangement may comprise a single shaft running through the cap(s) and secured on either side with nuts in a typical jam-nut arrangement. Other fastener or connection options are possible as well. For example, (as shown below) the interface members may take the form of racks, as an element of a rack-and-pinion drive system.

FIG. 12 is a side-section view of an alternate transducer 120 configuration, in which, instead of employing two concave structures facing away from one another, the two concave/frustum sections 122 face towards each other. The preload or bias on the EPAM™ layers forces the film into shape to maintain a shim or spacer 124 between caps 42. As shown, the spacer comprises an annular body. The caps may also include an opening in this variation of the invention as well as others. Note also that the inward-facing variation of the invention in FIG. 12 does not require an intermediate frame member 24 between individual cartridge sections 22. Indeed, the EPAM™ layers on each side of the device can contact one another. Thus, in situations where mounting space is limited, this variation of the invention may offer benefits.

A mechanical structure other than an opposing frustum structure may be used to provide the preload or bias on the EPAM™ diaphragm of an actuator. Spring-biased mechanisms are highly suitable to provide the preload on diaphragm.

Figure 13A:
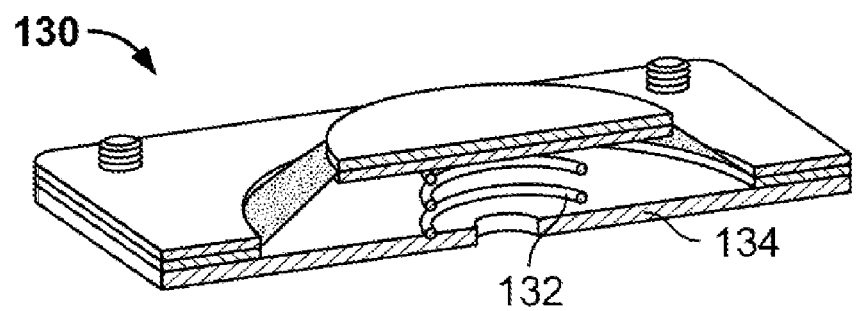
FIG. 13A is a sectional perspective view of a coil spring-biased single frustum transducer.
Figure 13B:
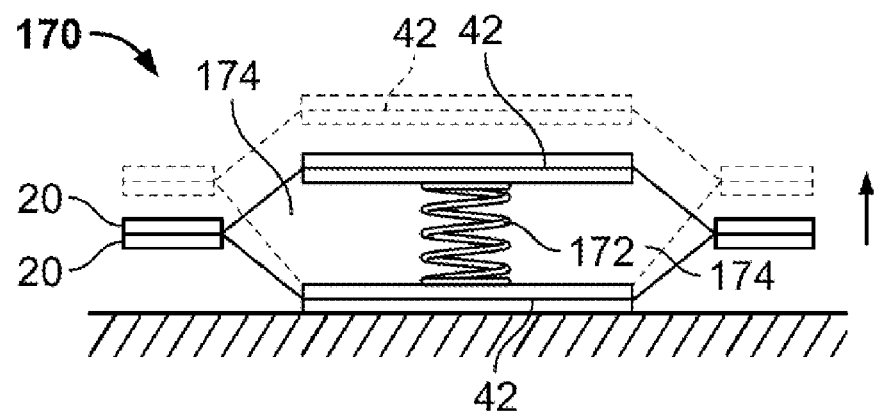
FIG. 13B is a side section view of a coil spring-biased double frustum transducer.

FIG. 13A provides a sectional perspective view of a coil spring-biased single frustum transducer 130. Here, a coil spring 132 interposed between cap 42 and a baffle wall 134 associated with the frame (or part of the frame itself) biases the EPAM™ structure. A similar coil spring structure provides the preload in a double-frustum actuator 170 is shown in FIG. 13B. Here, coil spring 172 is interposed between and biases two concave/frustum sections 174 which face toward each other. Unlike the inward facing double-frustum transducer device 120 of FIG. 12, the cap 42 of one of the transducers is fixed or mounted, thereby providing a single-phase actuator where the "free" transducer 174 translates twice the distance in the biased direction (as shown in phantom) as each transducer of the two-phase actuator.

Figure 14:
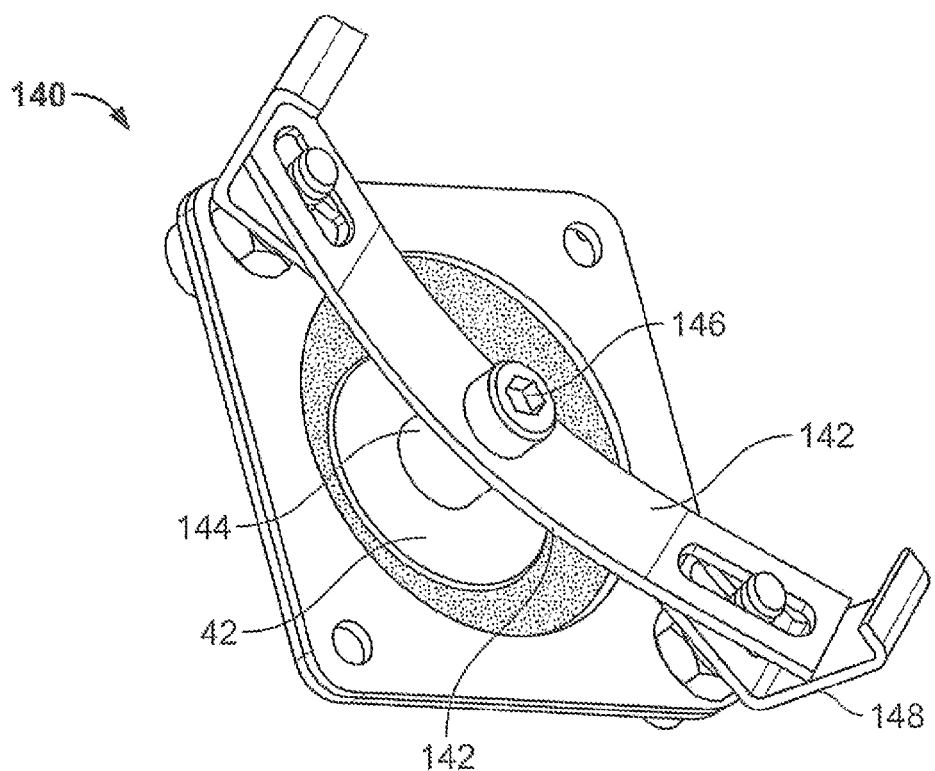
FIG. 14 is a perspective view of a leaf spring-biased single frustum transducer.

In the transducer 140 shown in FIG. 14, a leaf spring 142 biases the cap portion of a transducer. The leaf spring is shown attached to a boss 144 by a bolt 146 or a spacer captured between the bold and a nut (not shown) on the other side of the cap. The ends of the leaf are guided by rails 148.

Figure 15:
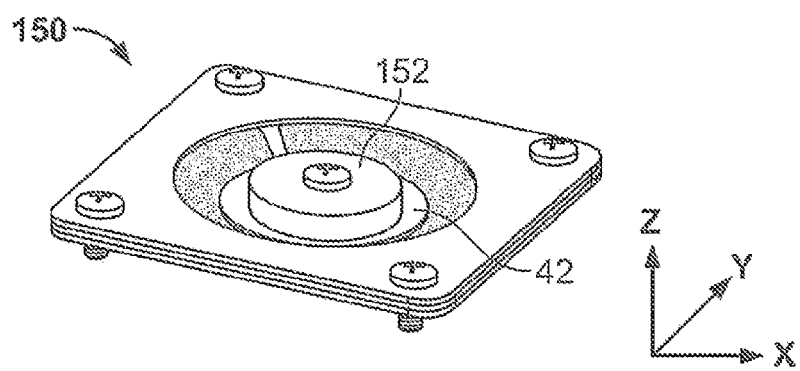
FIG. 15 is a perspective view of a weight-biased single frustum transducer.

In another transducer example 150 illustrated by FIG. 15, the EPAM™ film may be biased by a simple weight 152 attached to or formed integral with the cap(s) 42. Though the device is shown tilted up for the sake of viewing, it will typically be lie flat so that the pull of gravity on the weight 152 symmetrical biases the transducer along a Z-axis. In another mode of use, the weight/mass 152 may be employed when running the transducer within a given frequency range as an inertial bias member as referenced above.

Based on the above, it should be apparent that any number of parameters of the subject transducers can be varied to suit a given application. A non-exhaustive list includes: the output fastener or connection means associated with the cap (be it a threaded boss, spacer, shaft, ring, disc, etc.); prestrain on the EPAM™ film (magnitude, angle or direction, etc.); film type (silicone, acrylic, polyurethane, etc.); film thickness; active vs. non-active layers; number of layers; number of film cartridges; number of phases; number of device "sides" and relative positioning of device sides.

High-Speed Acrylic Frustum Transducers

When acrylic film is employed as the dielectric component of the EPAM™, the assignee hereof discovered that by use of an appropriately weighted cap (i.e., one having its mass selected to generate resonance at or within a desired frequency of operation range), that the frustum architecture can be driven to output far more work energy than previously believed possible in connection with acrylic-based EPAM™ structures.

Such weighting may be accomplished in various manners. The mass of the cap may be tuned directly or indirectly by adding a body thereto. To tune it directly, material selection and/or design to a given volume (e.g., diameter, thickness, etc.) for the known density of material may be employed. Alternatively, mass may simply be attached to the cap of the device as shown in FIG. 15, or by way of boss/standoff 144 and/or bolt 146 in FIG. 14.

Something unique about the frustum architecture allows it to be driven with large deflection upwards of 50 Hz even when employing acrylic-based EPAM™. As commented upon above, all experience in the art had indicated that device amplitude dropped-off with frequency for known acrylic film actuators. Contrary to published teaching and common knowledge, however, it is indeed possible to design certain acrylic EPAM™ actuators for high output between about 50 and about 100 Hz, and even greater than 100 Hz, up to about 200 Hz and beyond, potentially up to 1 kHz.

Certain acrylic-based actuators can be designed to yield maximum mechanical power output using traditional mass-spring or mass-spring-damper analysis. However, the key to the applicability of such analysis and/or ability to reach output, as described above, is actuator selection. The frustum architecture offers close agreement between actual performance and performances as modeled (i.e., within about 5% to 10% of each other).

Not to be bound by a particular theory, but it is believed that this result stems from the transducer configuration yielding output from a substantial portion or nearly all of the available EPAM™ diaphragm material expansion. Stated otherwise, this type of actuator derives it z-axis output from both the x and y components of film expansion.

Prior to this appreciation that certain acrylic transducer could be configured for high frequency maximum power output, the approach to deliver more power was to stack more successive EPAM™ layers or gang-up more "cartridges" as described above. However, the inventor hereof has instead been able to achieve from about 5× to above 10× gains in device power output by clocking devices with appropriately weighted caps at or near resonance in the ranged from about 50 to above 150 Hz.

By selecting an actuator with low losses in terms of its inherent use of material to drive device output, the system will then—and only then—offer performance predicted by mass-spring or mass-spring-damper resonance analysis. Other examples of actuators capable of high frequency use when employing acrylic material are described below as well as means of modifying known architectures to achieve the desired power output.

Through this use, it is possible to provide an actuator system with properties heretofore not available. The high-frequency acrylic-based actuator designs enable electroactive polymer devices, such as motor-driven devices illustrated below, having power output and efficiency ratings competitive with those of conventional motor-driven devices. Methodologies associated with such power characteristics are also aspects of the present invention.

Frustum Transducer-Based Systems

Figure 16:
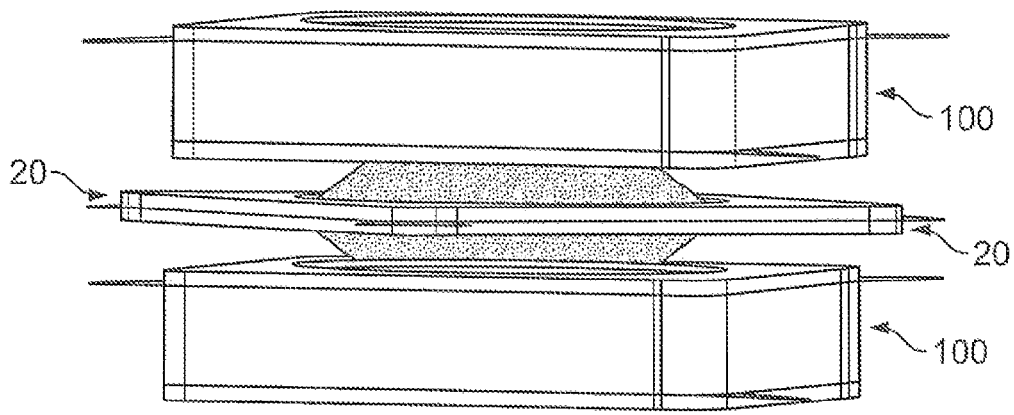
FIG. 16 is a perspective view of frustum-type transducers provided in series for stroke amplification.

The subject transducers can be employed in more complex assemblies than the component building-blocks described above. FIG. 16 provides a transducer example 160 in which a number of frustum-type transducer subunits 100 are stacked in series for stroke amplification. What is more, an inward facing double-frustum transducers 120 offers a second output phase through attachment to its frame 20. While the height of this member is stable due to its internal space (referenced above), the position of its frame is mobile to provide second stage output or input.

Instead of a center stage 120, a simple spacer may be employed between the outer transducers 100 for basic stroke amplification purposes. To further increase stroke, then, another such stack may be set on the first, etc. To offer another stage of actuation, another inward-facing transducer may be employed, etc. Yet another variation contemplates pairing an inward facing transducer with an outward facing transducer in actuator sensor pairs. Naturally, other combinations are possible as well.

Such systems may be tuned for high-frequency performance as described above, but the configuration offers another potential as well. Since the frame element of the center stage is "floating," this member may be also be weighted for resonance-frequency amplification purposes. Alternatively, or additionally, the internal spacer 124 of such a structure 120 as depicted in FIG. 12 could be mass-tuned as desired.

Suitable power supply modules to drive actuators according to the present invention include EMCO High Voltage Corp. (California) Q, E, F, G models and Pico Electronics, Inc. (New York) Series V V units. More typically, rather that switching a DC power supply to obtain high-frequency output, a custom power will be employed. In a basic variation, an AC transformer stepping up the voltage of 50/60 Hz wall-socket current can be employed. However, mobile systems will typically require a more sophisticated approach involving high-frequency DC switching applications, which circuits are becoming increasingly affordable/available or will be so shortly in view of their current trend in development.

While the inventive systems may include their subject power supply means, they may further comprise a number of flow control means. These means include valves, mixers and pumps. The pumps may be utilized for fluid or gas transfer under pressure, or used to generate vacuum. Valve structures may be fit to the pump bodies or integrated therein/therewith.

Exemplary Pump Systems

Figure 17A:
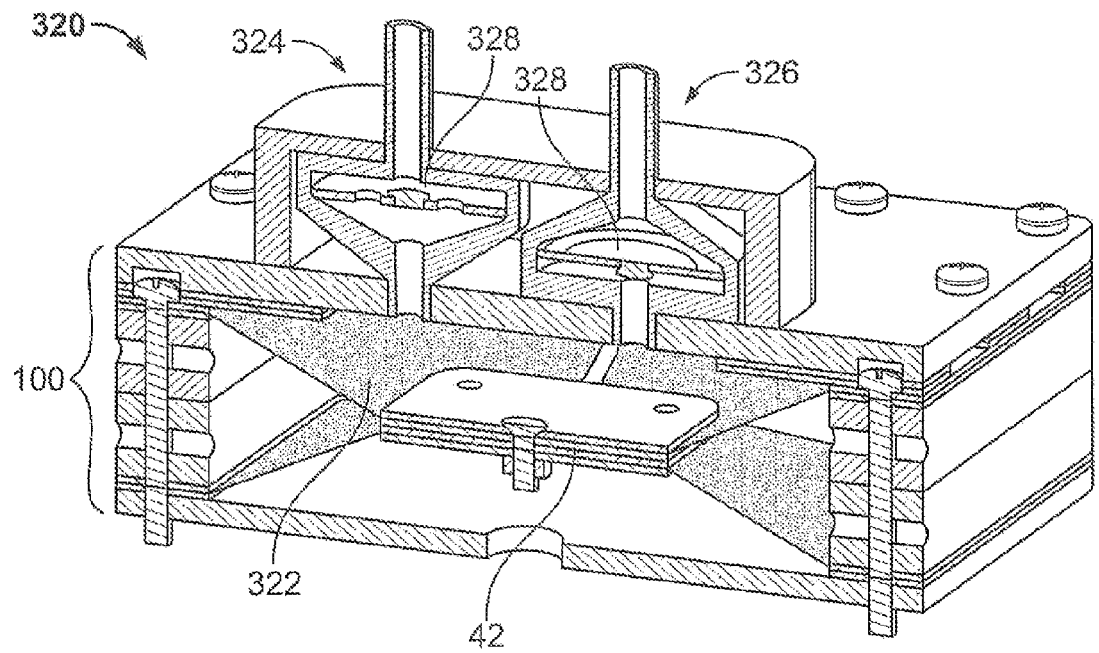
FIGS. 17A and 17B are sectional perspective views showing variations of a pump employing frustum-type actuators.
Figure 17B:
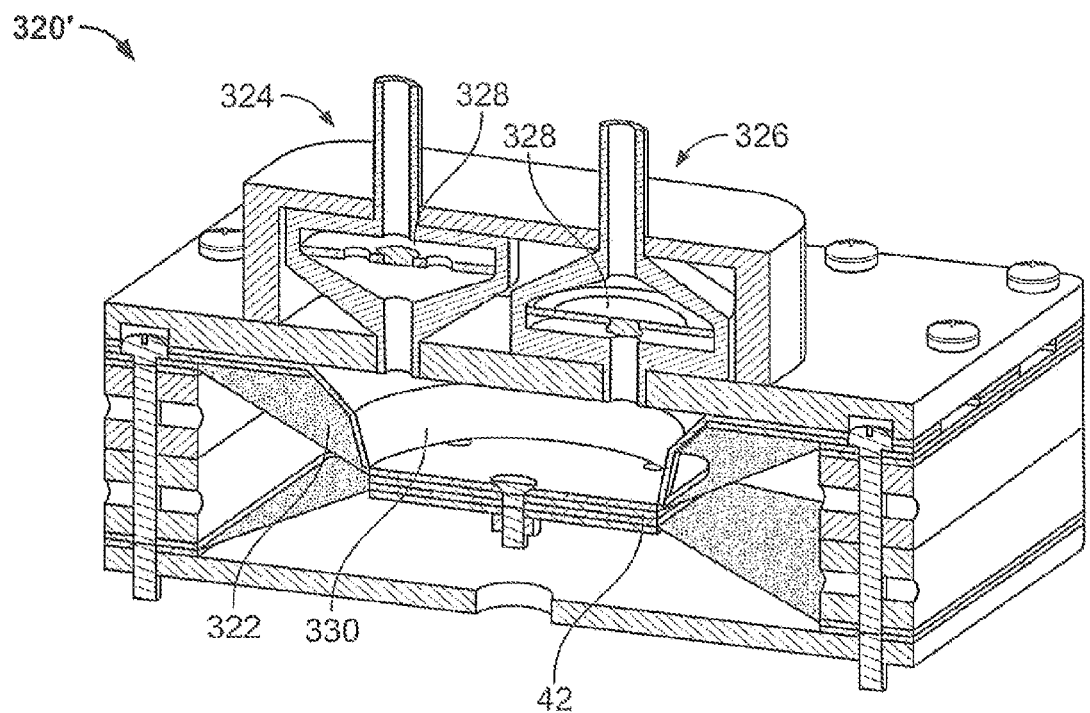

FIGS. 17A and 17B show variations of a first pump 320 and 320' employing double frustum-type actuators 100. Each device comprises a single chamber 322 diaphragm pump. The EPAM™ actuator section may be setup for single or two-phase actuation as discussed above in connection with the various double-frustum transducer designs. The pump includes a pair of passive check valves 324, 326 in which movement of a membrane 328 urged by fluid (including gas) pressure alternatively opens and closes the valves as is readily apparent.

Pump 320' in FIG. 17B is identical to that in FIG. 17A except that it includes a diaphragm wall 330 in addition to the cap/diaphragm 42 portion. Wall 330 provides an overall improved chamber wall interface (e.g., one that is less susceptible to elastic deformation, offering better material compatibility with caustic chemicals, etc.) than the EPAM™ film itself as employed in the previous pump variation.

Figure 18:
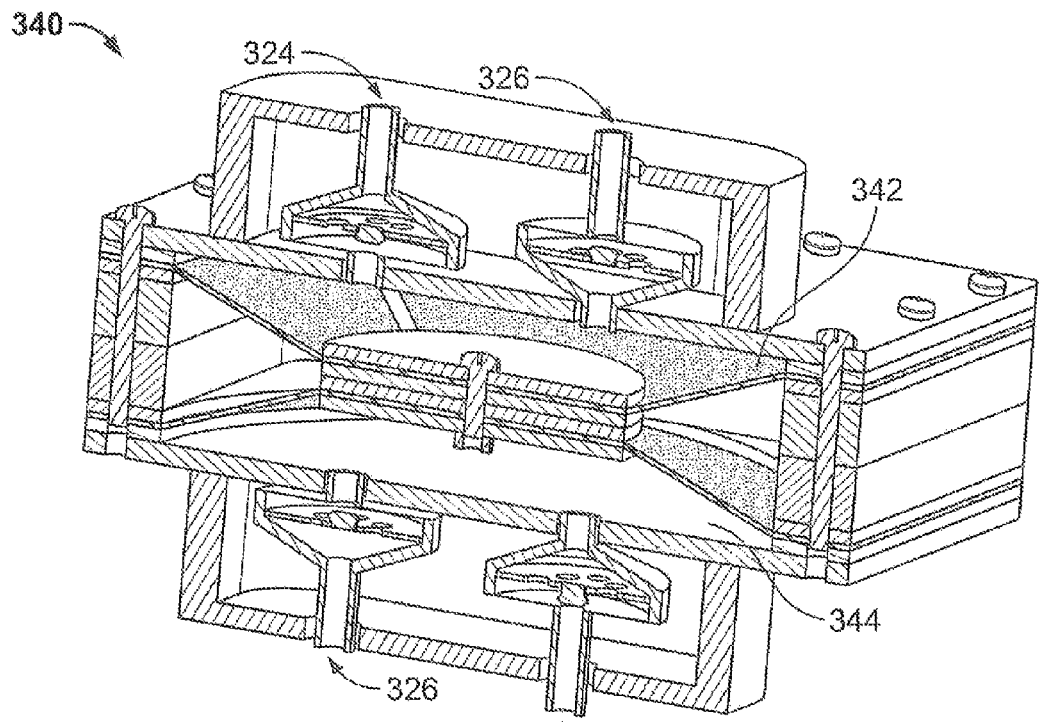
FIG. 18 is a sectional perspective view of a double-acting pump employing frustum-type actuators.

Like the previous devices, pump 340 shown in FIG. 18 employs passive check valves 324, 326. It differs from the devices, however, in that it embodies an integrated double chamber 342, 344 or double-acting pump. Again, the actuator may be a one-phase or two-phase type transducer. In another pump system variation, rather than employing passive check valves, EPAM™ valves may be employed as further described in the parent applications herein incorporated by reference.

Figure 33A:
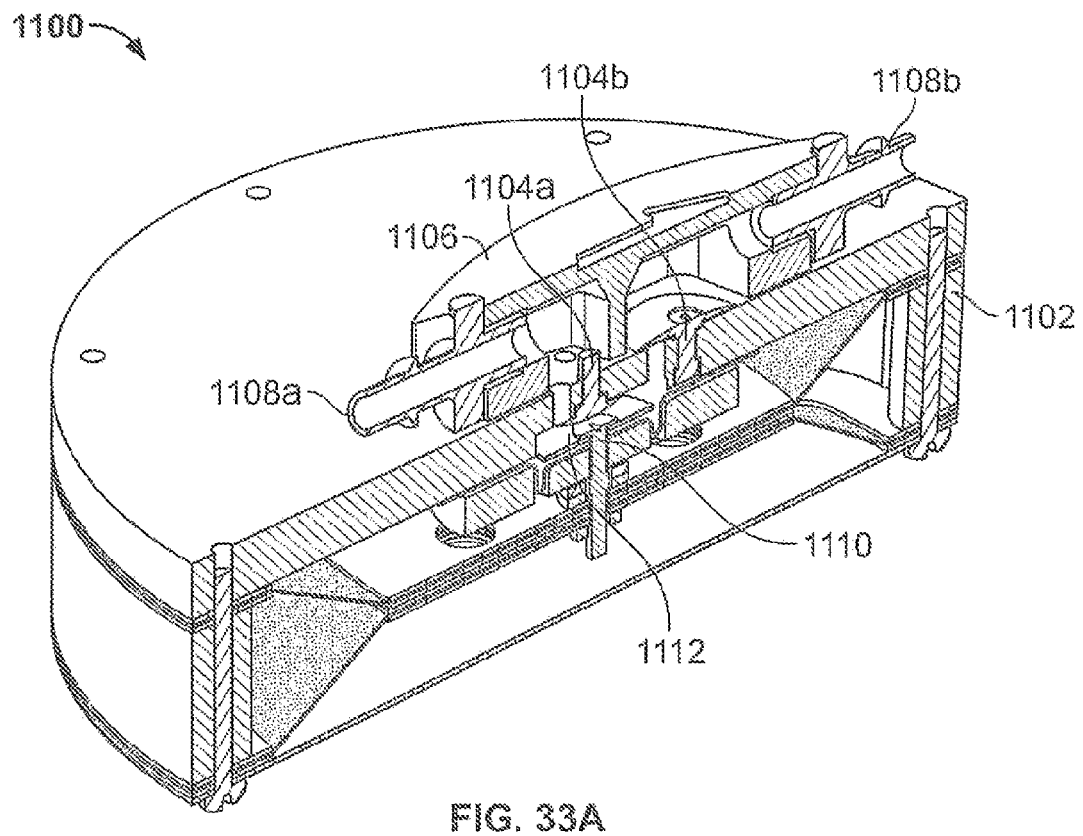
FIGS. 33A and 33B show cross-sectional perspective and side views of another pump system of the present invention.
Figure 33B:
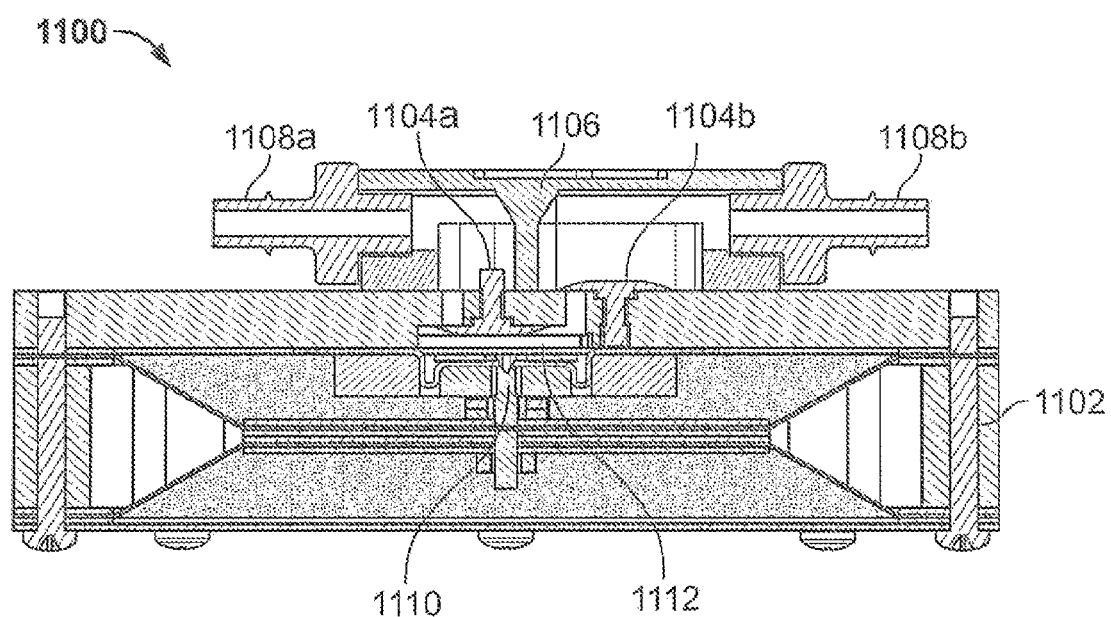

FIGS. 33A and 33B illustrate a pump system 1100 including an actuator 1102 having a frame which houses two one-way valve mechanisms which extend into a manifold housing 1106 having an intake manifold 1108a and an output manifold 1108b. In operation, during the down phase of actuator 1102, a diaphragm piston 1110 is pulled downward creating a negative pressure within chamber 1112 which causes valve 1104a to open and valve 1104b to close. On the upward phase of actuator 1102, diaphragm piston 1110 is pushed upward creating a positive pressure within chamber 1112 which causes valve 1104a to close and valve 1104b to open. In this manner, fluid or gases can be pumped into intake manifold 1108a through valve 1104a and to within chamber 1112, after which it is pumped from the chamber through valve 1104b and out output manifold 1108b.

In all of these pumps, as in other frustum actuator designs, to offer high-frequency actuation when acrylic dielectric material is used, the cap itself, the intermediate layers between the cap, or the hardware associated with the cap defining the truncated frustum may be weighted to yield the desired resonance-type performance. Furthermore, when so-designing systems for pumping applications, or others, loading conditions may be accounted for—such as damping or spring characteristics of the medium worked upon (e.g., air pushed by the pump).

Exemplary Valve System

Figure 19A:
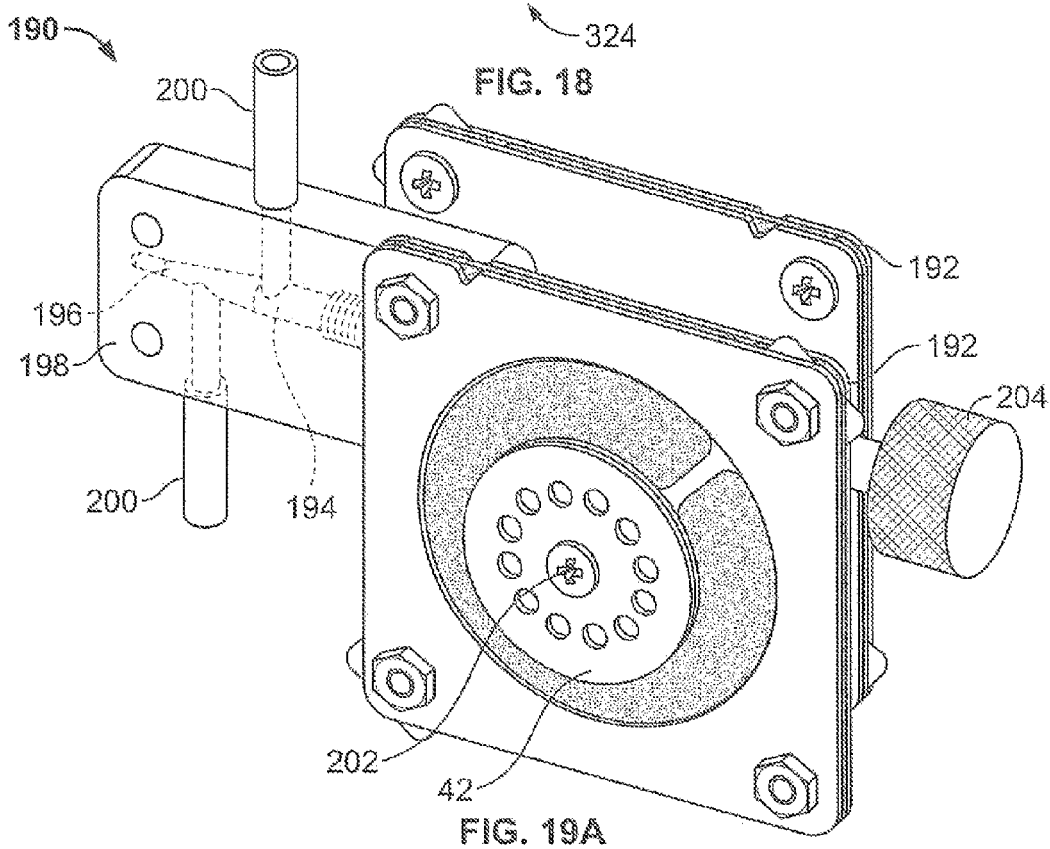
FIGS. 19A-19C provide views of another type of valve control system illustrative various different aspect of the present invention.
Figure 19B:
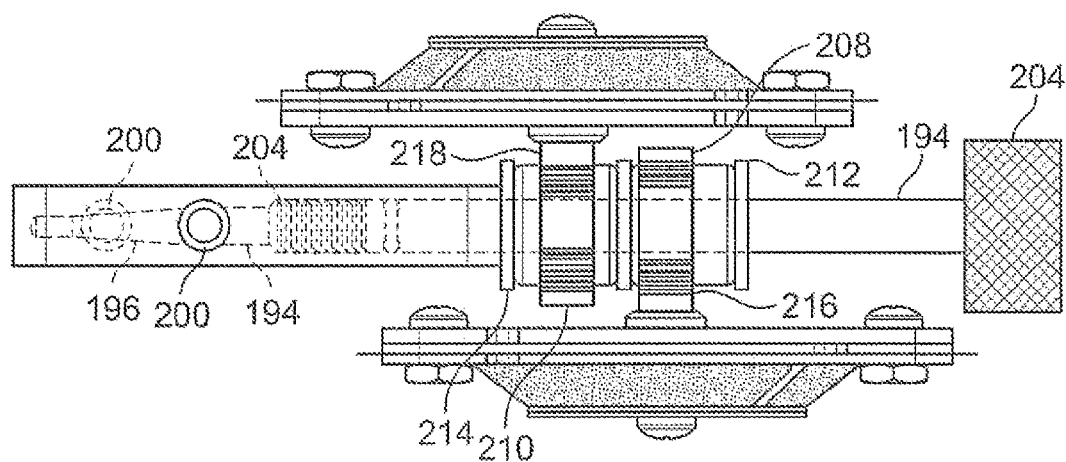
Figure 19C:
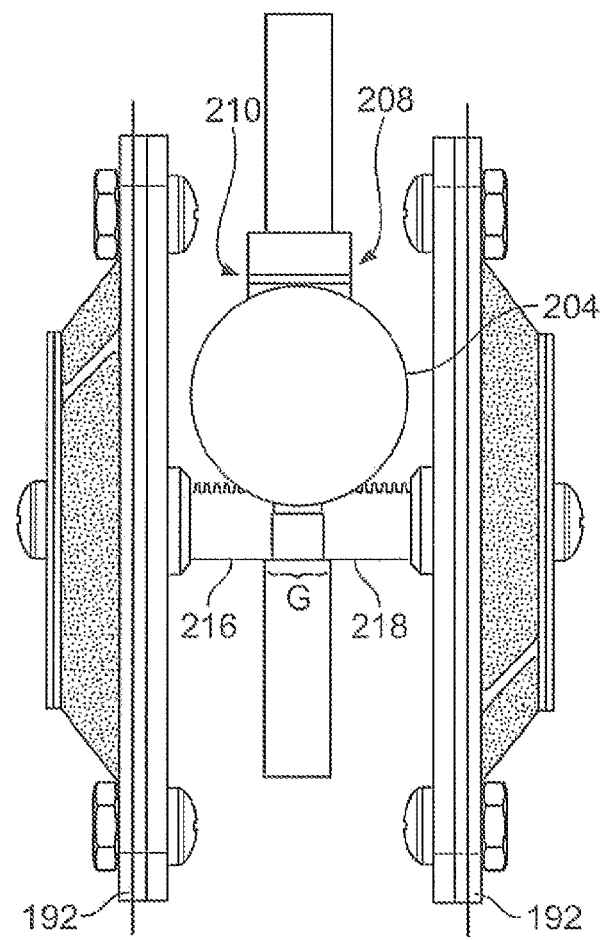

FIGS. 19A-19C provide views of another type of flow-control system that forms another aspect of the invention. In the perspective view of FIG. 19A, a valve assembly 190 is shown in which a pair of frustum-type actuators 192 drive a valve stem 194 for receipt within a seat 196 of a block 198 including input/output connections 200 for flow. An end dial or knob 204 is optionally coupled to valve stem 194 to allow manual adjustment of the device when not being driven by the actuators 192.

While not necessary, operating valve assembly 190 using the high-frequency acrylic teachings described herein is advantageous. Lightening holes 202 in cap 42 may offer another manner of tuning the mass of the body to yield desired performance.

Valve operation is accomplished by hardware as may be observed in connection with FIGS. 19B and 19C. Specifically, valve stem 194 is adjusted relative to seat 196 along threads 204. When viewed from above as in FIG. 19B, pinion gears 208 and 210 are set upon one-way roller clutch bearings 212, 214, respectively, engaging stem/shaft 194 when rotated in opposite directions (as indicated by arrows in FIG. 19B). Suitable clutch bearings for use with the present invention may be obtain from suppliers such as McMaster-Carr. Rack members 216 and 218 are set to mesh with the pinions when extended by the respective actuators 192. Because the racks are set beneath the pinions in the view provided by FIG. 19B, the racks are most easily viewed in FIG. 19C in which the pinion gears and clutch-bearings are now hidden by knob 204.

As shown in FIG. 19C, the rack members are spaced apart from a center line of the housing by a gap "G". This gap is such that neither rack meshes with the respective pinion until advanced by the actuator. In this manner, knob 204 can be turned in either direction by hand to manually effect valve adjustment. To automatically effect valve adjustment, operation of rack/pinion set 208/216 opens the valve, while operation of rack/pinion set 210/218 closes it (or vice versa depending on thread direction and/or clutch direction setting). In either case, driving one actuator in a cyclical manner opens the valve, while driving the other closes the valve. By integrating such a valve mechanism with a control system, many practical applications (e.g., drug/fluid infusion or perfusion) are made available.

Figure 20A:
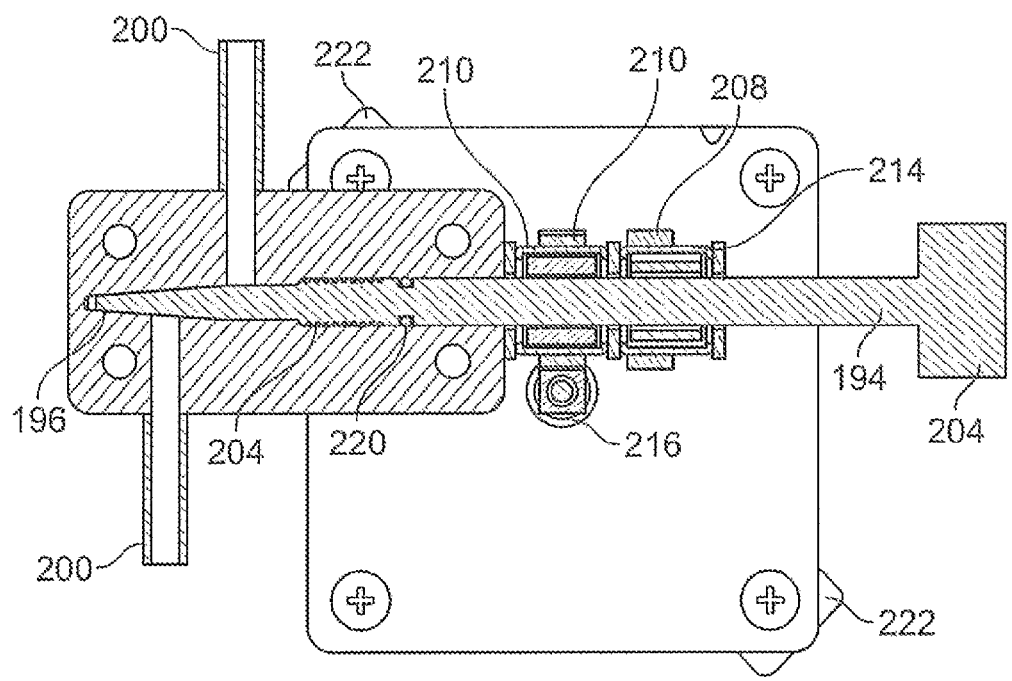
FIGS. 20A and 20B show sectional views of the system at two operational states.
Figure 20B:
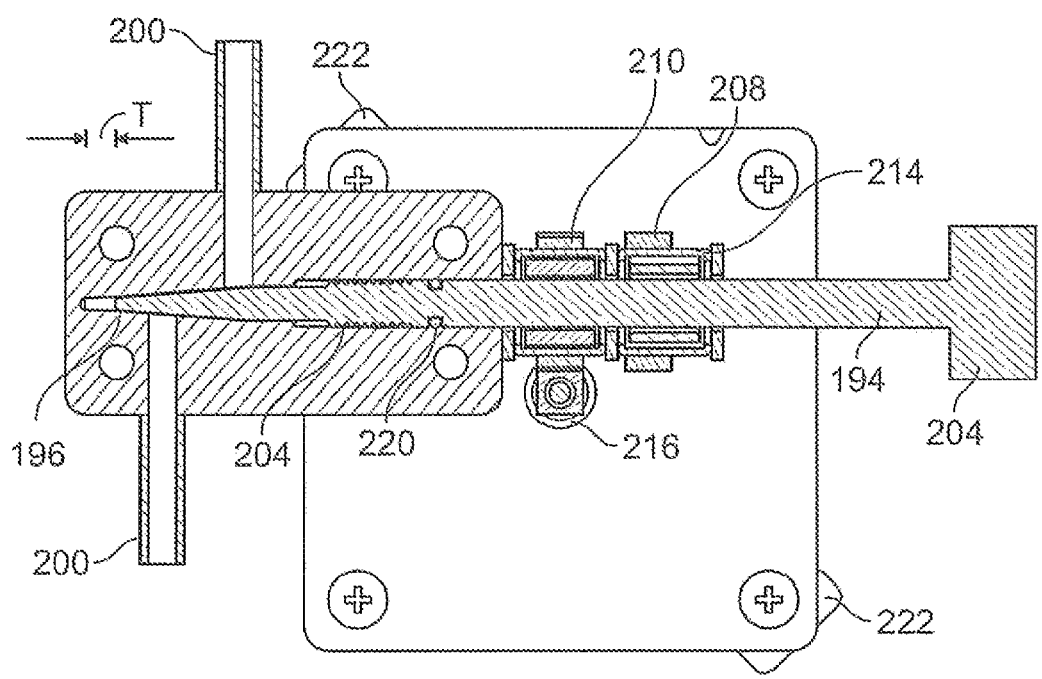

Regarding such a controlled valve operation, FIGS. 20A and 20B show valve control system 190 in cross-section in closed and open states, respectively. In FIG. 20B, the travel "T" of the valve stem is illustrated. In each view, additional components that would be expected to be included in such a system, including shaft seal 220, electrical connections for the actuators 222, roller clutch components, etc., are shown. As pictured, the output means for the illustrated drive assembly comprises a shaft. For use in other applications, the shaft could be coupled to a pulley, gear(s), a rocker arm, a cam, or other output means.

Exemplary Motor Systems

Various motor systems are now described which utilizes the EPAM actuators of the present invention with various motion-conversion mechanisms, including rack-and-pinion drives (FIGS. 28-30) and lead-screw drives (FIGS. 31 and 32).

Figure 28A:
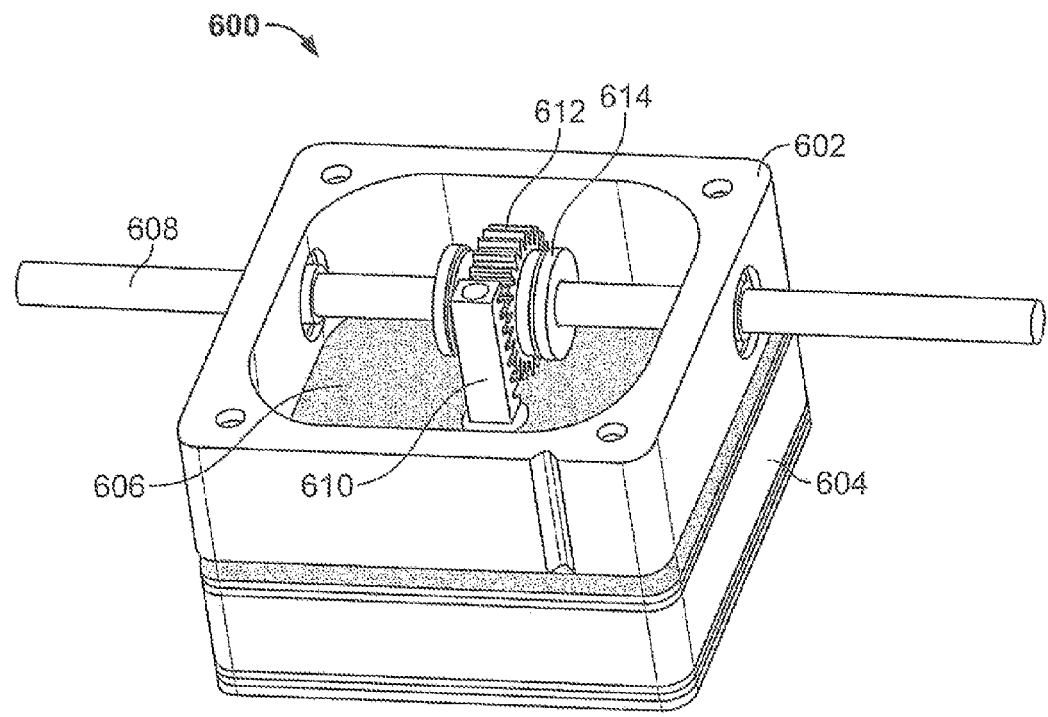
FIGS. 28A and 28B show perspective and top views of a single-clutch motor drive system of the present invention employing a stacked transducer of the present invention.
Figure 28B:
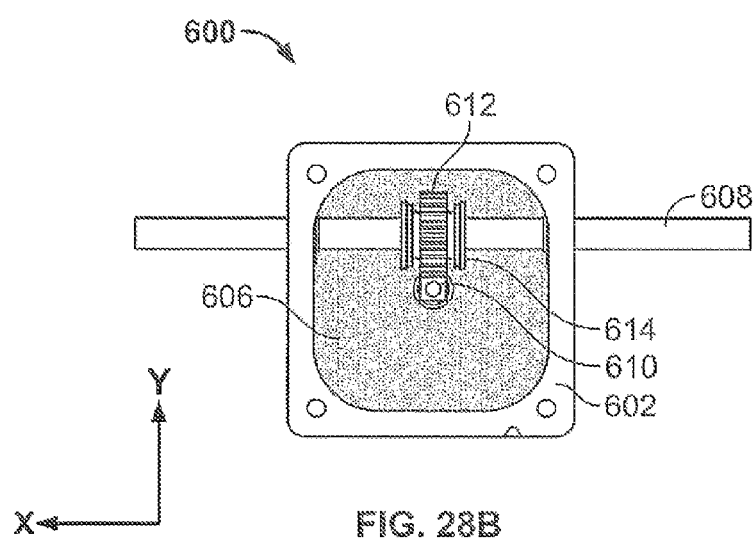

FIGS. 28A and 28B illustrate another configuration of a linear-to-rotary motor architecture 600 which offers high space efficiency. Motor system 600 includes a "stacked" actuator 604 which may have any number of serially positioned EPAM transducers 606 to produce displacement of a rack 610. The rack 610, pinion 612 and one-way roller clutch 614 assembly is efficiently housed within a walled frame 602 stacked on actuator 604. A rod 608 rotationally mounted within frame 602 carries the pinion and clutch assembly. With this configuration, rod 608 is intermittently rotated in one direction. In a related variation not shown, a second pinion and clutch assembly positioned on the opposite side of the rack equipped with a secondary set of teeth for meshing with the second pinion provides alternative outputs. In which case, the second pinion-clutch assembly provides one-way movement driving the second output rod in the opposite rotational direction of the first pinion-clutch assembly. As a further variation of the two-shaft approach, the motion of the second rod is coupled to the first rod (e.g., by way of an interposed spur gear or pinion) in order would harness the total energy output of the actuator.

Figure 29A:
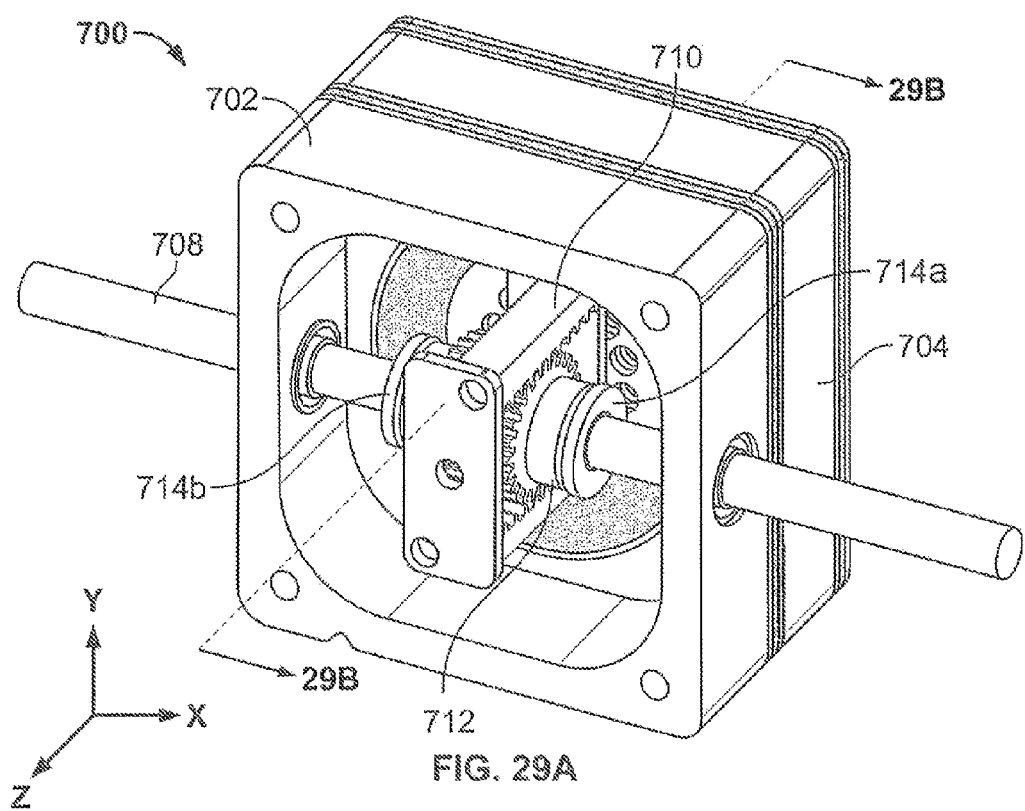
FIGS. 29A and 29B show perspective and side cross-sectional views of a double-clutch, single pinion motor drive system of the present invention.
Figure 29B:
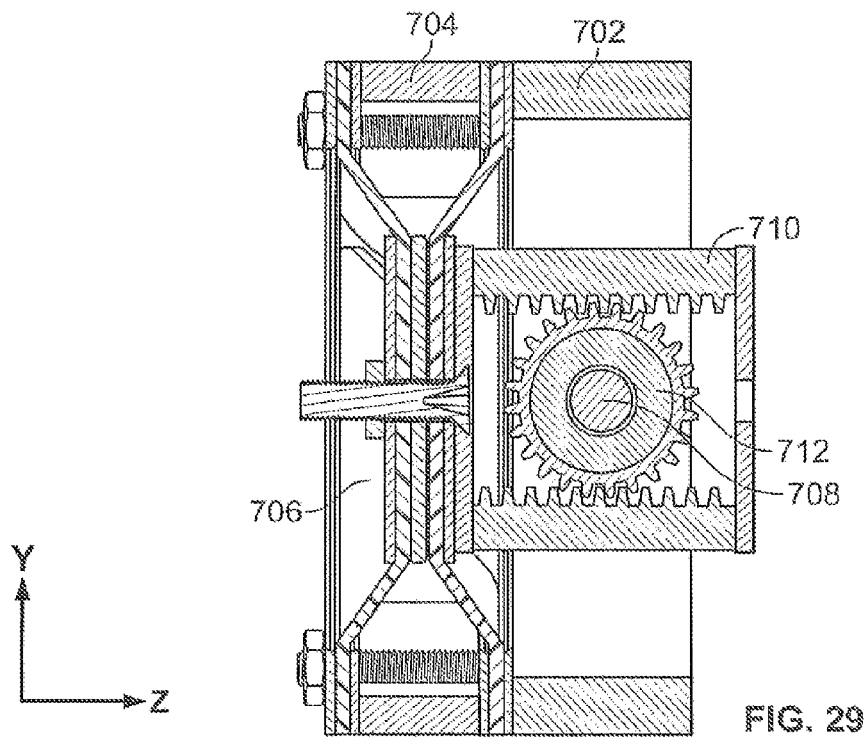

FIGS. 29A and 29B illustrate another configuration of a motor architecture 700 including actuator 704 having a stacked transducer assembly 706 for displacing rack 710.

Rack 710 engages a pinion 712 set upon two one-way clutches 714a, 714b. The rack 710, pinion 712 and one-way clutches 714a, 714b are housed within a walled frame 702 mounted on actuator 704. Output rod 708 is rotationally mounted within frame 702 and carries the pinion and clutch assembly. The clutches are configured to engage and rotate rod 708 in the same direction but at different phases of the transducer actuation cycle. In other words, when transducer 706 moves in one direction, clutch 714a is engaged to rotate rod 708 and when transducer 706 moves in the opposite direction, clutch 714b is engaged to rotate rod 708 in the same direction. Thus, instead of the intermittent output rod rotation provided by the motor of FIGS. 28A and 28B, motor 700 enables the output rod to rotate continuously.

Figure 30A:
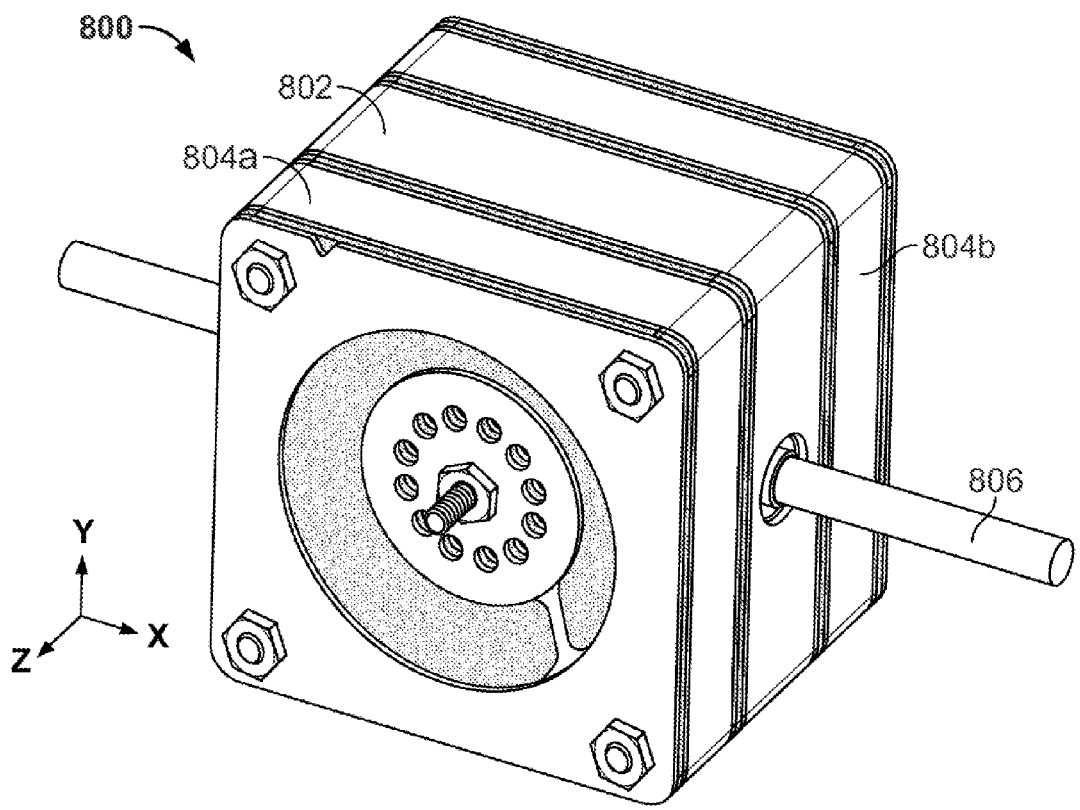
FIGS. 30A-30C show perspective, cross-sectional and end views, respectively, of a double-clutch, double-pinion motor drive system of the present invention.
Figure 30B:
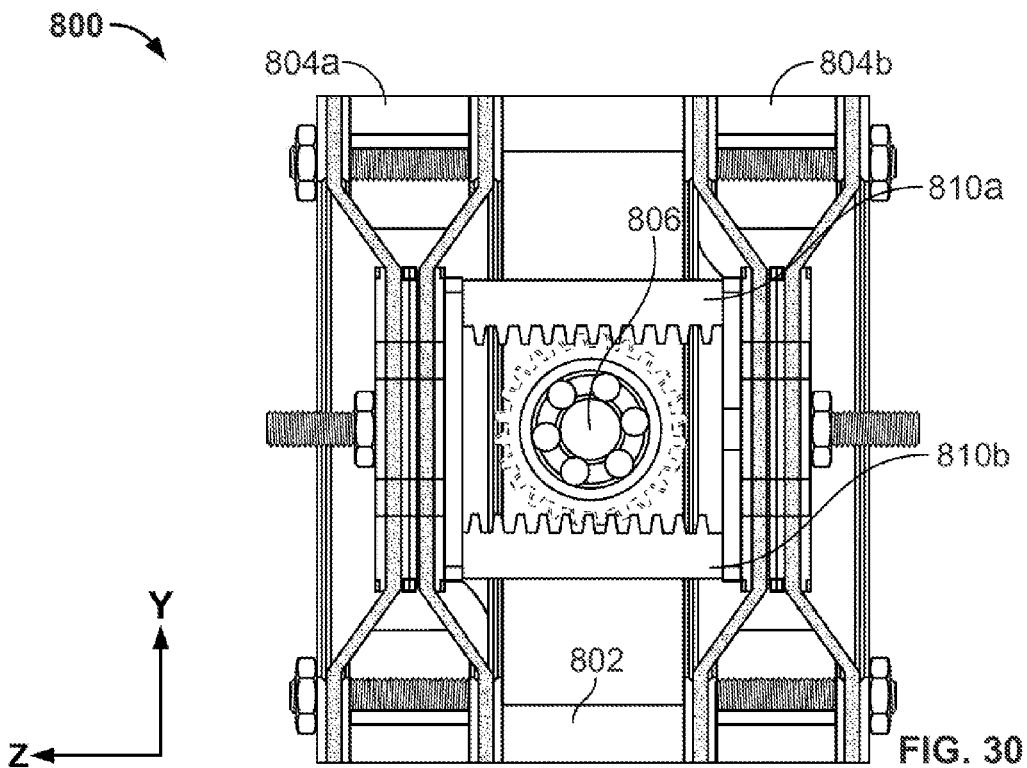
Figure 30C:
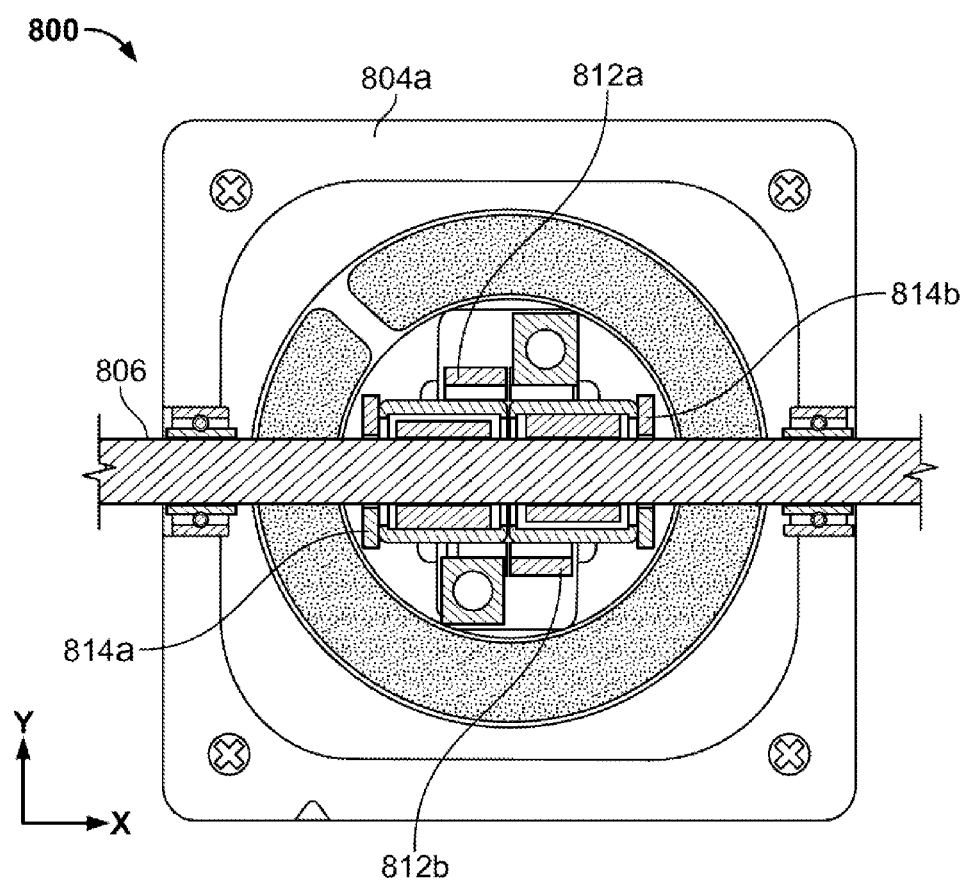

FIGS. 30A-30C illustrate yet another motor 800 of the present invention in which the gear assembly housed by frame 802 and the associated output rod or shaft 806 mounted therein are sandwiched between two stacked actuators 804a, 804b. The actuators together alternatively actuate rack and pinion drive sets 810a, 812a and 810b, 812b, as evidenced by the slight offset between the teeth of the two pinions. A clutch 814a is configured to engage the first drive set to rotate shaft 806 continuously in one direction and another clutch 814b is configured to engage the second drive set to rotate shaft 806 continuously in the opposite direction. FIGS. 30A-30C illustrate yet another motor 800 of the present invention in which the gear assembly housed by frame 802 and the associated output rod 806 mounted therein are sandwiched between two stacked actuators 804a, 804b.

Figure 31A:
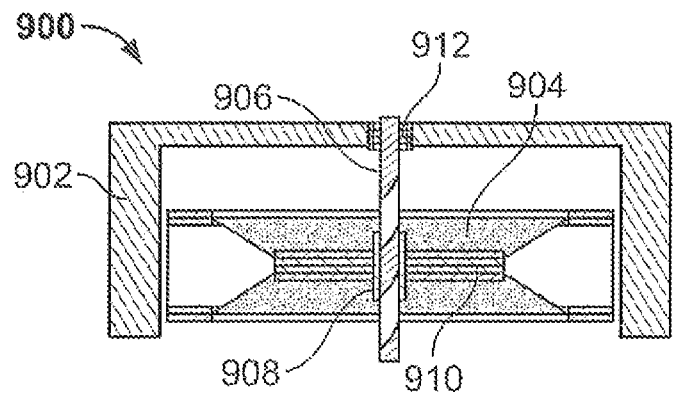
FIGS. 31A-31C show cross-sectional views of a single-clutch, lead screw motor drive system of the present invention.
Figure 31B:
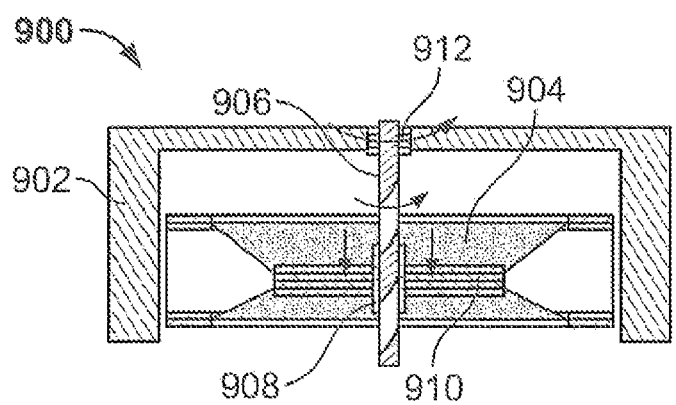
Figure 31C:
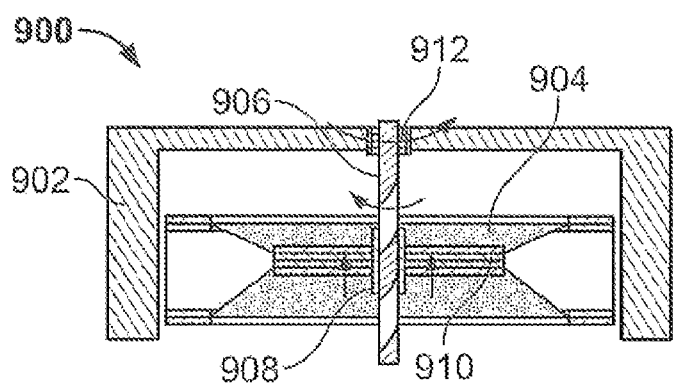

FIGS. 31A-31C illustrate a lead-screw type motor 900 including a drum or wheel frame 902 mounted to a double frustum actuator 904 by way of threaded rod or screw 906 co-axial aligned with the axis of actuation of the actuator transducers. A slider mechanism 908 affixed to the stacked transducer caps 910 is configured to translate the axial linear motion imposed on it by actuator 904 to rotational movement of lead-screw 906. Slider 908 has internal tongue that matches the shape and pitch of the threads of screw 906 and, as such, reduces lead-screw backlash while minimizing friction on the lead-screw 906. A one-way clutch mechanism 912 coupled to wheel 902 is positioned to co-axially receive screw 906. The EPAM actuator contains a lead-screw slider 908 which maintains a linear path without rotating. Thus, upon application of voltage to actuator 904, as illustrated in FIG. 31B, the actuator's displacement moves slider 908 in a first linear direction (e.g., downward) which in turn forces screw 906 to rotate in a first rotational direction (e.g., counter-clockwise). As actuator 904 returns through its stroke, as illustrated in FIG. 31C, slider 906 moves in the opposite direction (e.g., upward) thereby rotating lead-screw 906 in a second rotational direction (e.g., clockwise) thereby creating an oscillating rotation with a given angular displacement. One-way clutch 912 in turn converts the screw's oscillating rotational movement into pure uni-directional (e.g., counter-clockwise) rotational movement of wheel 902.

Figure 32A:
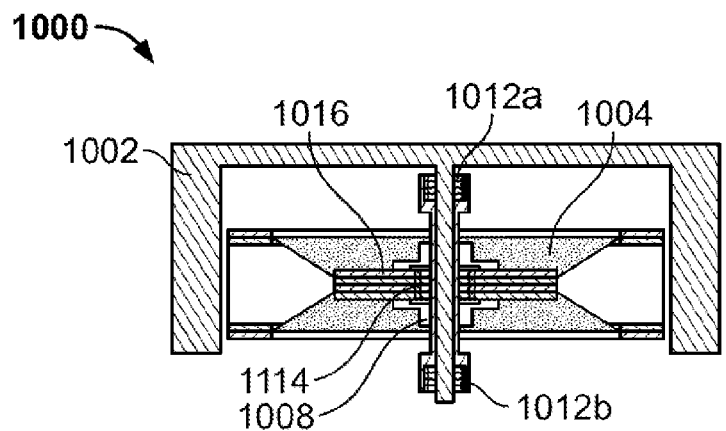
FIGS. 32A-32C show cross-sectional-views of a double-clutch, lead screw motor drive system of the present invention.
Figure 32B:
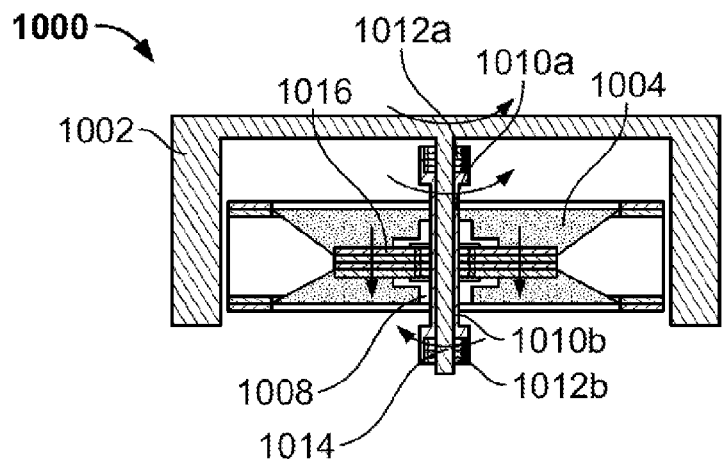
Figure 32C:
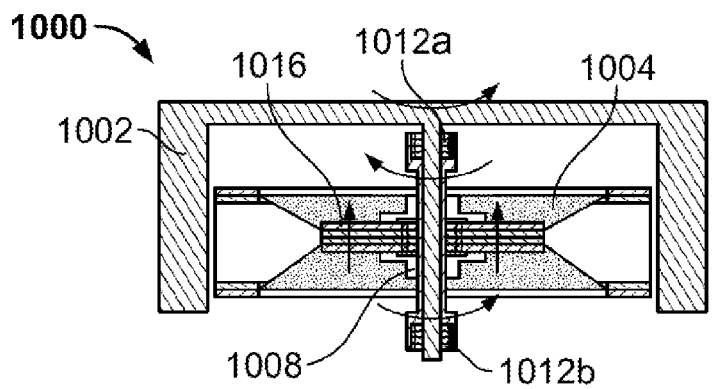

FIGS. 32A-32C illustrate a double clutch lead-screw motor 1000 including a drum or wheel frame 1002 having a centrally-disposed drive shaft 1014 about which a double frustum actuator 1004 is positioned. An axial coupler 1008, including a two-way clutch mechanism 1016, affixed and linearly driven by actuator 1004 interfaces the internally facing ends of a right hand pitched lead-screw 1010a to a left hand pitched lead screw 1010b therein, where drive shaft 1014 is centrally positioned within the lead screws. Each output end of the screws is received by a one-way clutch 1012a, 1012b, respectively. This configuration creates a double-clutch effect to provide rotation of the screws with both strokes of the EPAM actuator 1004. Upon application of voltage to actuator 1004, as illustrated in FIG. 32B, the actuator's displacement moves coupler 1008 in a first linear direction (e.g., downward) which in turn forces screw 1010a to rotate in a first rotational direction (e.g., counter-clockwise) and screw 1010b to rotate in a second, opposite rotational direction (e.g., clockwise). As actuator 1004 returns through its stroke, as illustrated in FIG. 32C, coupler 1008 moves in the opposite direction (e.g., upward) thereby rotating lead-screw 1010a in a second rotational direction (e.g., counter-clockwise) and rotating lead-screw 1010b in the first rotational direction (e.g., clockwise). The screws' oscillating rotational movement which is translated to shaft 1114 is converted into pure uni-directional (e.g., counter-clockwise) rotational movement of by the one-way clutches 1012a, 1012b.

The pitch of the lead-screws can be non-constant to compensate directly for force/stroke profiles generated by EPAM actuators. Similarly, through lead-screw pitch design, different torque ratios can be designed for the actuators. The co-axial alignment between the lead screws and the EPAM axis provides greater flexibility in the form factor density or the motor allows the EPAM actuator to be packaged either inside or outside the rotating output component (e.g., wheel).

One skilled in the art will recognize a plethora of combinations of the subject EPAM actuated motors to selectively drive any number of output members in a desired direction.

Exemplary Lighting Systems

As mentioned above, the EPAM™ actuators of the present invention also have application in the lighting industry, in the context of both wall socket (120V/60 Hz power) driven/stationary lighting systems and battery-operated/mobile lighting systems.

FIGS. 26A and 26B illustrate a schematic representation of an exemplary arrangement of such a lighting system 500. Here, a single-phase, single frustum-type EPAM™ actuator 502 is employed which includes a diaphragm 508 affixed to a frame 510. The diaphragm may be weighted with a cap 42 having a selected mass to achieve the desired resonance frequency of the diaphragm. The diaphragm may also be pre-biased upwards by any suitable biasing means (not shown), e.g., a spring, to enhance performance of the actuator. Actuator 502 is in positional contact with or otherwise mechanically coupled by way of a stem or rod 522 to a light source 506, which is any suitable light source depending on the application at hand. Upon application of a voltage to the actuator via lead lines 520 coupled to a power supply (not shown), diaphragm 508 relaxes and is moved in the Z-axis along with rod 522 and light source 506 are also displaced in the same direction, as illustrated in FIG. 26B.

Positioned about the light source is a reflector assembly which includes one or more reflectors, e.g., mirrors, or lenses. While any number of reflectors may be used, here, two reflectors are used—a primary reflector 512 positioned between actuator 502 and light source 506 and about the Z-axis to create the primary reflecting surface, and a secondary reflector 514 positioned on the opposite side of the light source. This arrangement provides a reflector "ring", however, any other suitable arrangement of reflectors and the resulting construct may be employed with the present invention. In the illustrated embodiment, secondary reflector 514, unlike primary reflector 512, is mechanically coupled to light source 506, and therefore exhibits no movement relative to light source 506 (i.e., secondary reflector is displaced together with the light source). In other embodiments, the light source and the secondary reflector may be stationary and the primary reflector movable relative thereto. The latter configuration is advantageous where the light source/secondary reflector combination is heavier than the primary reflector or where type of light source used is particularly sensitive to vibrational movement such as a filament type incandescent bulb.

In any case, primary reflector 512 is designed to do the bulk of the variable direction ray reflection. For example, at least half of the light emitted from light source 506 is designed to hit primary reflector 512 first and be reflected in the desired direction without the necessity of being diverted by secondary reflectors. Secondary reflector 514 is responsible for diverting rays emitted from light source 506 in the upper hemisphere back down to primary reflector 512 in a concentrated ray. Depending on the application, a tertiary reflector or reflectors (not shown), which are also stationary relative to the primary reflector, may be employed to assist in redirecting stray rays from the light source. In any case, the resulting reflected light ray is made up of substantially all available light provided by light source 506.

By operating EPAM actuator 502 between the high and low positions, as shown in FIGS. 26A and 26B, respectively, (or between any number of positions therebetween) at a frequency which is greater than that perceptible by the human eye, i.e., >25 Hz, light source 506 is moved relative to the primary reflector 512. The variable focal length to the reflector ring creates the ability to change the overall focus of the emitted light. As illustrated, broader band light rays 516 are provided when the light source is in the "low" position and narrower band light rays 518 are provided when the light source is in the "high" position.

Any arrangement of actuators, light sources and reflectors/lenses may be employed in the subject systems where the relative motion between the light source(s) and reflector(s)/lens(es) is adjusted at a high rate of speed. As such, an alternative arrangement to the one illustrated in FIGS. 26A and 26B is one that couples the reflector assembly, or one or more reflectors/lenses thereof, to the EPAM actuator to adjust its position relative to the light source(s). Alternatively, both the light source as well as the reflector assembly may be driven by their own actuator to provide more control over the direction and diffusion of the light vector. Individual reflectors/lenses or groups of reflectors/lens may be driven or moved independently of each other to provide multi-faceted directionality to the light rays. Furthermore, any number EPAM diaphragms may be used to construct the subject actuators. For example, actuators having a stacked diaphragm configuration may be used to increase maximum displacement of a light source and/or reflector assembly.

Figures 27A, 27B:
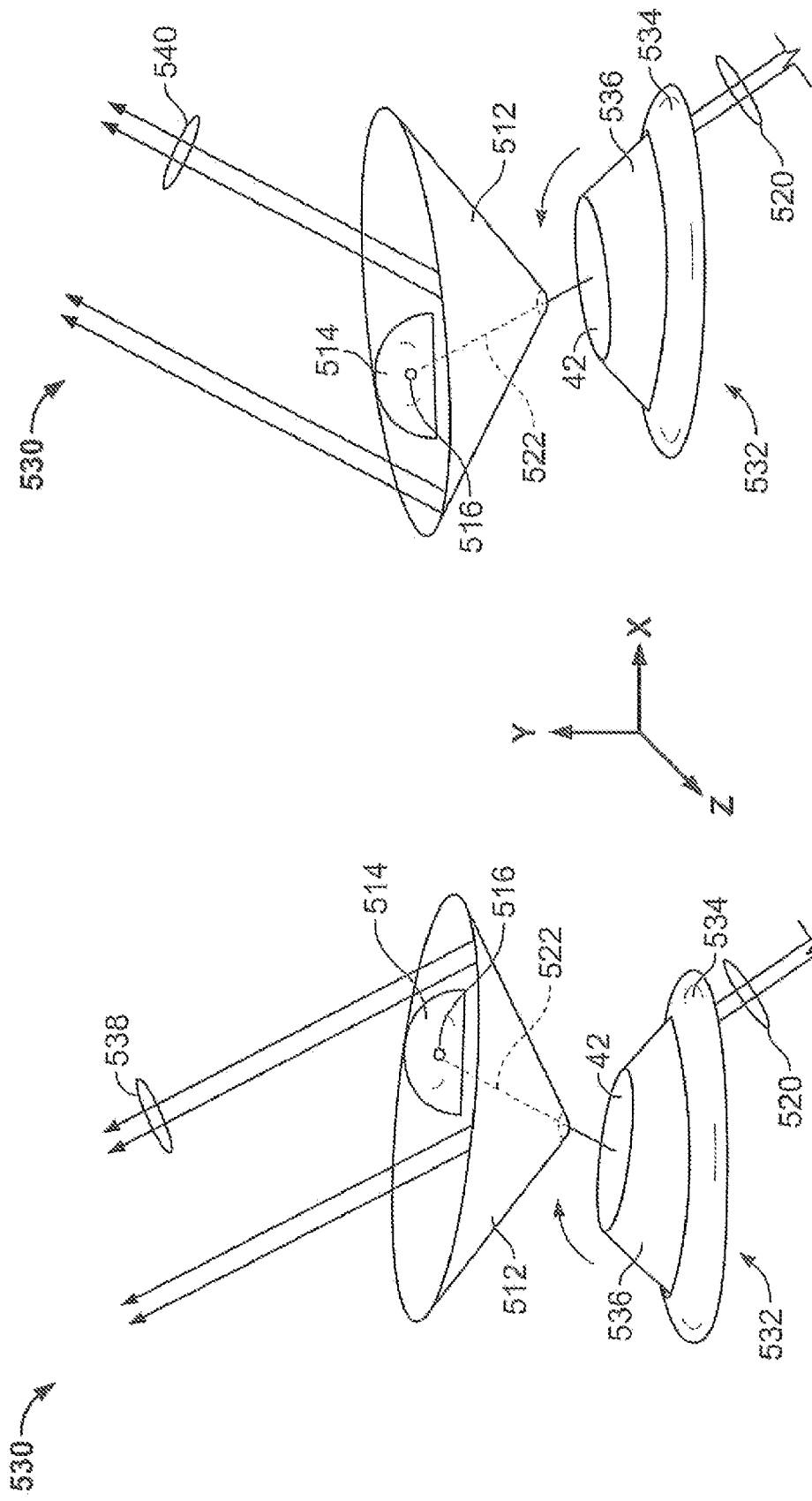
FIGS. 27A and 27B provide a schematic illustration of another embodiment of a lighting system employing a frustum-type actuator of the present invention.

Still further, a multi-phase EPAM actuator may be employed to provide a unique lighting pattern, e.g., a strobe effect, flashing, etc. For example, a single, variable-phase actuator, such as the type illustrated in FIG. 8, may be used to displace the light source and/or the reflector/lens assembly to change directionality of the light rays where the directionality depends on the "phase" in which the actuator is operated. Such a lighting system 530 is illustrated in FIGS. 27A and 27B, where selected portions of the multi-phase diaphragm 536 of actuator 532 having frame 534 can be activated to change the direction of the reflected rays. The diaphragm may have any number of phases to provide the desired effect. For example, FIGS. 27A and 27B show actuator 532 acting in a bi-lateral manner to provide left-directed rays 538 and right-directed rays 540. A greater number of phases may be employed to produce a rotating light effect, such as those used on emergency vehicles, or a "wobble" pattern.

This technology may be used to amplify any and all types of light in any and all types of lighting applications—standard lighting applications driven by 120V AC outlet power as well as mobile lighting applications, such as in any self-propelled vehicle (automobiles, planes, ships), manually-propelled vehicle (bicycles) and battery-operated application (flash lights, etc.).

In home lighting applications, for example, the system may be designed to have a volume of a standard light bulb. The actuator may be a single phase diaphragm stack approximately 35 mm in diameter (approximates that of a standard light bulb size). In one variation, a resonant frequency transformer (RFT) may be used to power the system directly off of a 120 VAC—60 Hz power line. By using an RFT rather than a standard transformer, the actuator device appears as a purely resistive load rather than as a capacitive and resistive load with an undesirable power factor. In a basic form, the power supply is a standard high voltage transformer converting 120V AC 60 Hz into 2500V AC, 60 Hz. This would drive the EPAM actuator at 120 Hz because the effective 60 Hz waveform has two maximum peaks and thus yields two displacements per cycle. At this frequency, the occurrence of flicker or beat interference from other devices would be minimized if unlikely to occur. Moreover, such a configuration optimizes the ratio of input voltage to diaphragm displacement.

Those skilled in the art will appreciate than any number of lighting system architectures of the present invention may be employed for mobile lighting applications. An aspect of the systems is achieve an efficient input voltage-to-diaphragm displacement ratio by providing or tuning the EPAM actuators to operate at their natural frequency. Suitable power supplies for such mobile applications are configured to generate high oscillating voltages from a DC power source, such as a high voltage transistor array. Any increase in space requirements of the power supply are offset by the reduced requirement for bulky chemical energy storage, i.e., batteries, as the power supply is lighter than most batteries, making the overall system lighter and more efficient.

As for light sources, any type may be employed with the subject systems, depending on the desired lighting effect. For example, for directed light, light-emitting diodes (LEDs) may be employed, whereas conventional incandescent lights may be used to produce diff-use light. Short arc high intensity discharge light sources are the closest to point light sources and are therefore easily usable in a high efficiency light systems of the present invention.

Known Transducers Modified for High-Speed Performance

Figure 21A:
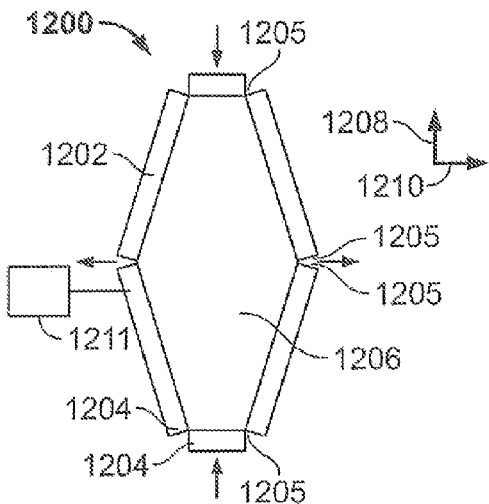
FIGS. 21A, 21B, 21C and 21D show known "bow", "bowtie" and "spider" type transducers.

FIG. 21A shows a known actuator 1200 that may be modified for use according an aspect of the present invention. The "bow" type actuator 1200 is a planar mechanism comprising a flexible frame 1202 which provides mechanical assistance to improve conversion from electrical energy to mechanical energy for a polymer diaphragm 1206 attached to the frame 1202. The frame 1202 includes six substantially rigid strut members 1204 connected at joints 1205. The struts 1204 and joints 1205 provide mechanical assistance by coupling polymer deflection in a planar direction 1208 into mechanical output in a perpendicular planar direction 1210. More specifically, the frame 1202 is arranged such that a small deflection of the polymer 1206 in the direction 1208 improves displacement in the perpendicular planar direction 1210.

Attached to opposing (top and bottom) surfaces of the polymer 1206 are electrodes (bottom electrode on bottom side of polymer 1206 not shown) to provide a voltage difference across a portion of the polymer 1206. Polymer 1206 is configured with different levels of pre-strain in its orthogonal directions. More specifically, electroactive polymer 1206 includes a high pre-strain in the planar direction 1208, and little or no pre-strain in the perpendicular planar direction 1210. This anisotropic pre-strain is arranged relative to the geometry of the frame 1202. More specifically, upon actuation, the polymer contracts in the high pre-strained direction 1208. With the restricted motion of frame 1202 and the lever arm provided by members 1204, this contraction helps drive deflection in the perpendicular planar direction 1210. Thus, even for a short deflection of polymer 1206 in high pre-strain direction 1208, frame 1202 bows outward in direction 1210. In this manner, a small contraction in the high pre-strain direction becomes a larger expansion in the relatively low pre-strain direction.

Using the anisotropic pre-strain and constraint provided by frame 1202, bow actuator 1200 allows contraction in one direction to enhance mechanical deflection and electrical to mechanical conversion in another. In other words, a load 1211 attached to the bow actuator is coupled to deflection of polymer 1206 in two directions—direction 1208 and 1210. Thus, as a result of the differential pre-strain of polymer 1206 and the geometry of the frame 1202, the bow actuator is able to provide a larger mechanical displacement and mechanical energy output than an electroactive polymer alone for common electrical input.

The pre-strain in EPAM™ 1206 and constraint provided by frame 1202 may also allow the bow-type actuator to use lower actuation voltages for the pre-strained polymer for a given deflection. As bow actuator 1200 has a lower effective modulus of elasticity in the low pre-strained direction 1210, the mechanical constraint provided by frame 1202 allows the bow actuator to be actuated in direction 1210 to a larger deflection with a lower voltage. In addition, the high pre-strain in direction 1208 increases the breakdown strength of the polymer 1206, permitting higher voltages and higher deflections for the actuator 1200.

In one variation, the bow actuator may include additional components to provide mechanical assistance and enhance deflection. By way of example, springs (not shown) may be attached to bow actuator 1200 to enhance deflection in direction 1210. The springs load the actuator such that the spring force exerted by the spring(s) opposes resistance provided by an external load. In some cases, the springs provide increasing assistance for bow actuator 1200 deflection. In addition, pre-strain may be increased or made more uniform to enhance deflection by relying on spring tension instead for shaping the device. The load may also be coupled to the rigid members 1204 on top and bottom of the frame 1202 rather than on the rigid members of the side of the frame 1202.

Figure 21B:
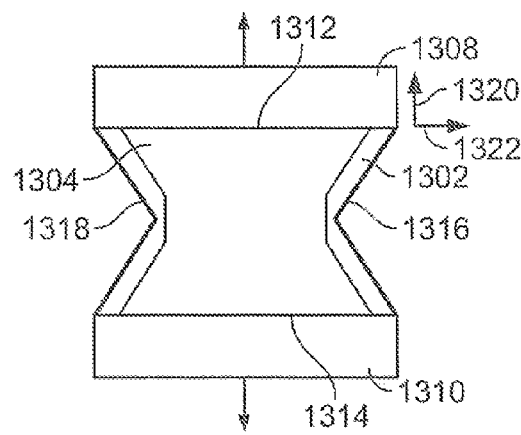

FIG. 21B illustrates another known actuator 1300 that may be suitably modified for use the present invention. "Bowtie" actuator 1300 includes a polymer diaphragm 1302 arranged in a manner which causes a portion of the polymer to deflect in response to a change in electric field. Electrodes 1304 are attached to opposite surfaces (only the foremost electrode is shown) of the EPAM™ material and cover all of a substantial portion of polymer 1302. Two stiff spar or base members 1308 and 1310 extend along opposite edges 1312 and 1314 of polymer 1302. Strut flexures 1316 and 1318 are situated along the remaining edges of polymer 1302. Flexures 1316 and 1318 improve conversion from electrical energy to mechanical energy for actuator 1300.

Flexures 1316 and 1318 cause polymer diaphragm 1302 to deflect in another direction. In one embodiment, each of the flexures rests at an angle about 45 degrees in the plane of polymer 1302. Upon actuation of the device, expansion of EPAM™ material 1302 in direction 1320 causes stiff members 1308 and 1310 to move apart, as indicated by arrows. In addition, expansion of the polymer in direction 1322 causes flexures 1316 and 1318 to straighten, and concurrently separating the base members 1308 and 1310. In this manner, actuator 1300 couples expansion of polymer 1302 in both planar directions 1320 and 1322 into mechanical output in direction 1320.

The polymer may, again, be configured with different levels of pre-strain in orthogonal directions 1320 and 1322. Such anisotropic pre-strain is arranged relative to the geometry of flexures 1316 and 1318. More specifically, polymer 1302 may include a higher pre-strain in direction 1320, and little or no pre-strain in the perpendicular planar direction 1322.

Figure 21C:
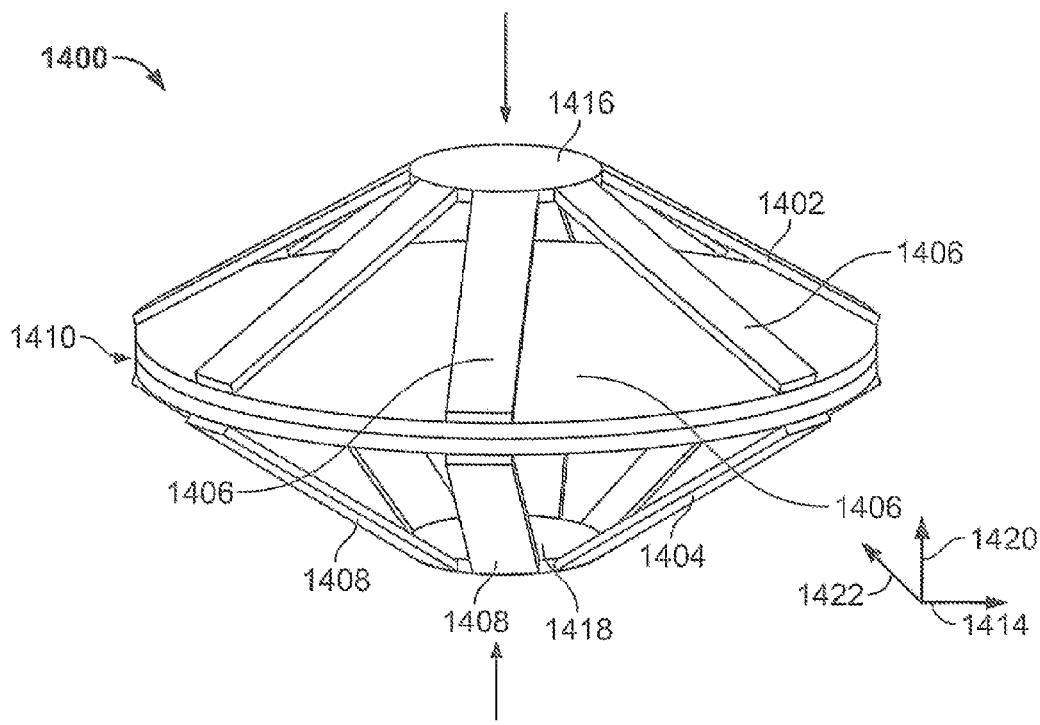

FIG. 21C shows yet another known type of actuator 1400 that employs the EPAM™ material with such efficiency as to make it amenable for high-frequency use according to the present invention. Specifically, a "spider" type actuator 1400, superficially resembling to a Moonie or cymbal type piezoelectric actuator, employs a radially symmetric shell or frame comprising a top portion 1402 having struts 1406 extending radially outward and downward from a base 1416, and a bottom portion 1404 having struts 1408 extending radially outward and upward from a base 1418. The concave sides of the shell portions 1402, 1404 face each other where the respective strut ends meet or coapt at a common interface 1410 and are attached to the edge of a flat EPAM™ diaphragm 1412 or an intermediate ring membrane. Attached to opposing (top and bottom) surfaces of the polymer diaphragm 1412 are electrodes (not shown) to provide a voltage difference across a portion of the polymer 1412. Upon application of a voltage to the electrodes, the struts provide mechanical output by transferring polymer deflection in a planar direction 1414, 1422 into mechanical compression in a direction orthogonal 1420 to the plane of the diaphragm 1412.

The polymer material of the spider actuator may be configured with an evenly distributed pre-strain or may be configured with different levels of pre-strain. For example, in one embodiment, interface 1410 defines a circle where the pre-strain is distributed evenly and radially throughout the polymer 1412. With embodiments where pairs of diametrically opposed struts have a length which is different from that of other pairs of diametrically opposed struts, a non-circular (e.g., oval, elliptical, etc.) interface 1410 is formed. Using a non-circular shell configuration with a polymer having an unrestrained or natural circular shape will result in directional differences in pre-strain. As such, the relative lengths of the struts may be selected to achieve the directional pre-strain desired.

Figure 21D:
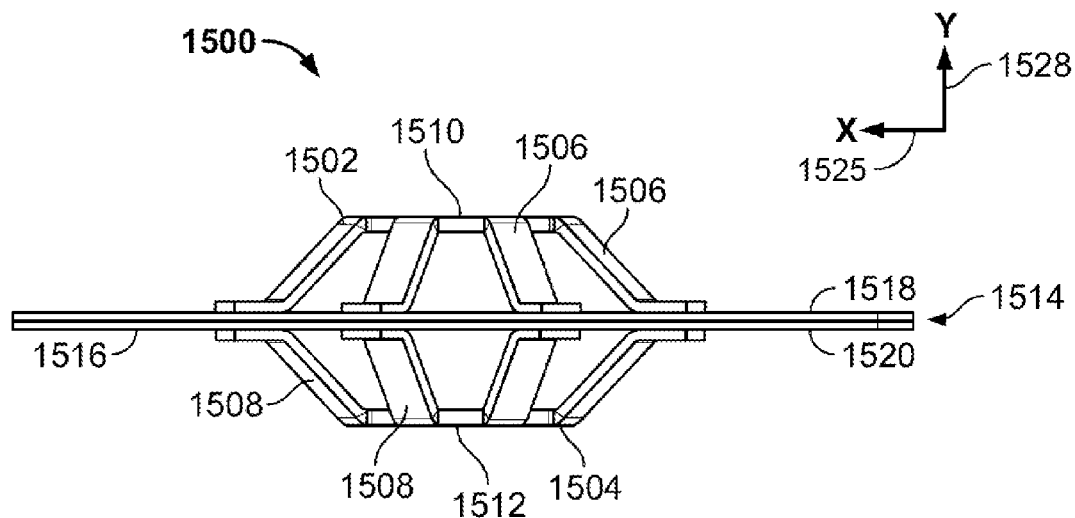

Another "spider" type actuator 1500 for high-frequency applications is illustrated in FIG. 21D. Actuator 1500 includes a similar construct to that of FIG. 21O, however here, the frame includes the strut structure having top and bottom portions 1502, 1504 as well as planar frames 1518, 1520. Each shell portion includes struts 1506, 1508, respectively, extending radially from a base 1510, 1512 where opposing top and bottom struts ends coapt at an interface 1514 sandwiched between planar frames 1518, 1520. Extending and sandwiched between the strut ends is a flat EPAM™ diaphragm having top and bottom electrodes (top electrode 1522 is viewable in FIG. 22D) covering a substantial portion of the top and bottom surfaces of polymer 1516. Upon application of a voltage to the electrodes, the struts provide mechanical output by transferring polymer deflection in a planar direction 1525 into mechanical compression in a direction orthogonal 1528 to the plane of the diaphragm.

For use according to the present invention, FIGS. 22A-22D show modified versions of the above-referenced actuations in FIGS. 21A-21D. While certain modifications are required according to the present invention as described below, numerous optional variations ranging from changing the manner of pre-strain described above, substituting pivots for flexures, altering straight-line geometry to curvilinear forms, increasing or decreasing the number of frame or (i.e., flexure and/or "stiff members"), varying the length of the shell struts, altering the EPAM™ material shape or aspect ratio (e.g., from circular to elliptical, to square, etc.), or other modification is contemplated. However, the characteristics of the system should not be so changed in form as to substantially lose geometric efficiency causing the actuators to no longer perform substantially as expected when employing acrylic-based EPAM™ and clocked at higher speeds as contemplated herein.

Figure 22A:
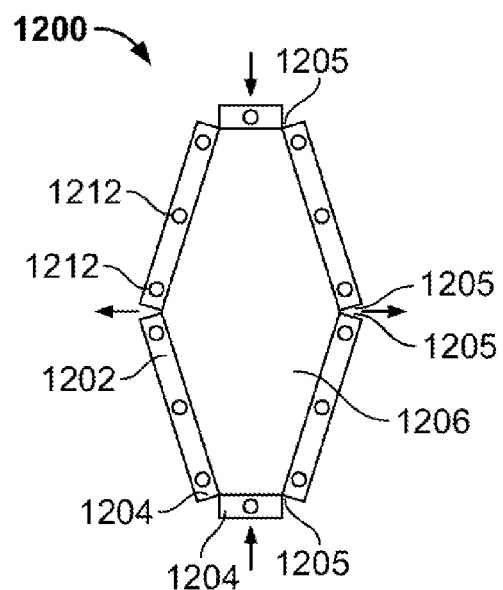
FIGS. 22A-22D show these transducers modified according to an aspect of the present invention.
Figure 22B:
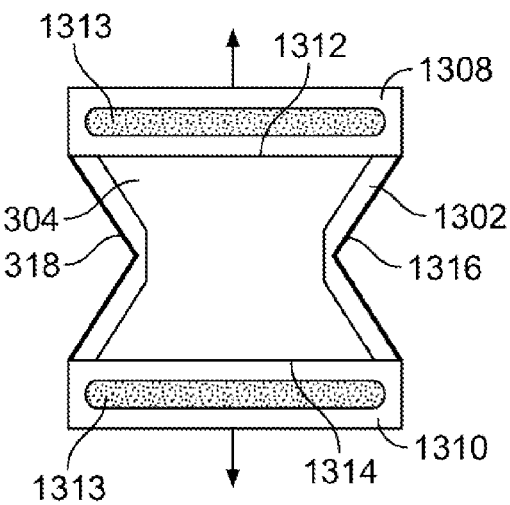
Figure 22C:
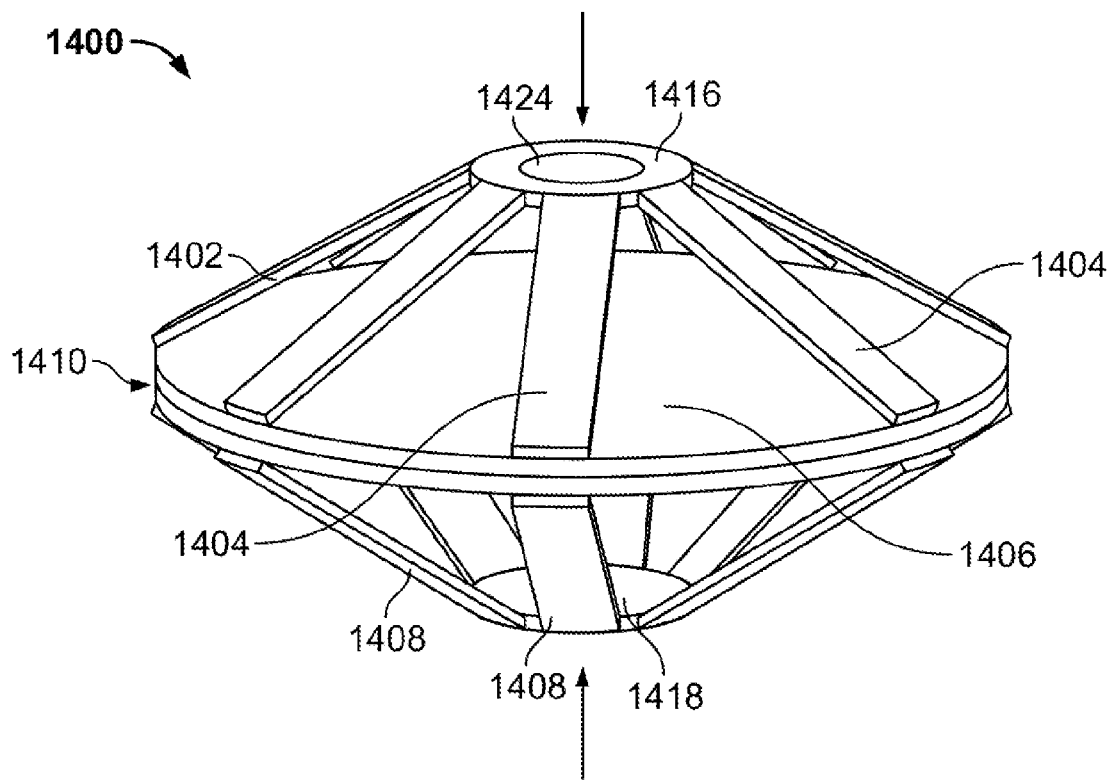
Figure 22D:
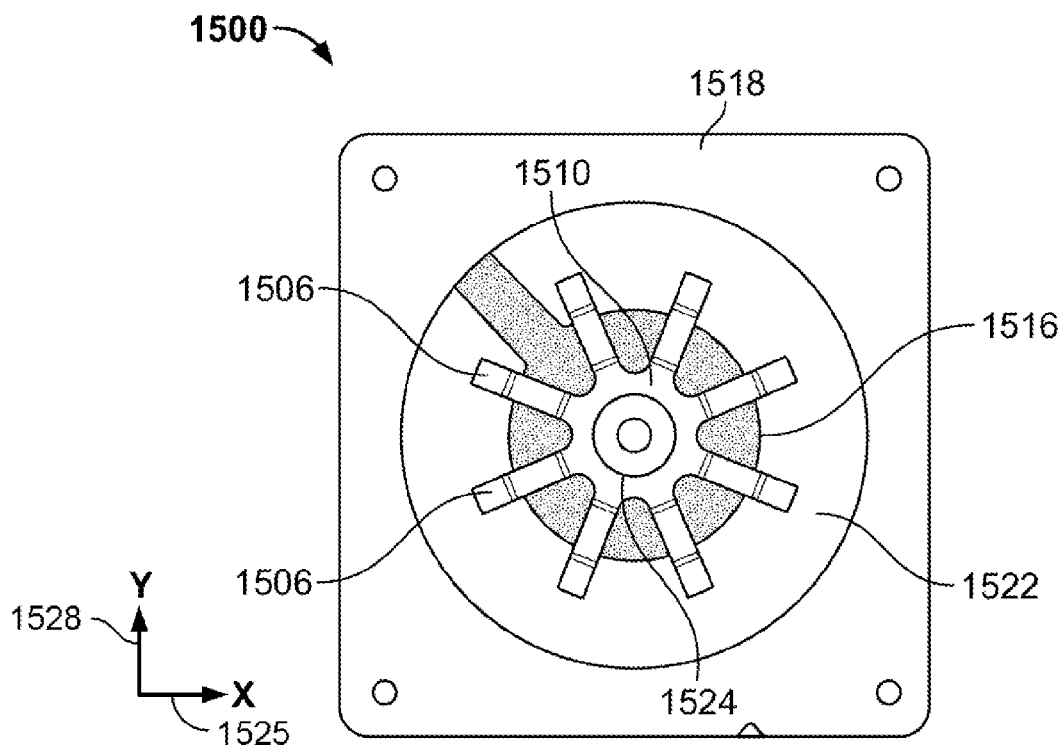

As for modifying the subject devices according to the present invention, this is accomplished through perimeter or extremity weighting of one or more device frame elements. In FIG. 22A, these weight or mass elements are shown as optionally comprising slugs 1212. In FIG. 22B, these weight or mass elements are shown as optionally comprising bars 1313 inserted in the base members. In FIGS. 22C and 22D, the weight or mass elements are shown as discs 1424, 1524, respectively, attached to the top and bottom shell faces or bases. Still further, these various bow, bowtie and spider type actuators may be employed as high-speed acrylic-based devices through weighting associated with output connection features (not shown), such as rods, racks, gears, etc.

Bi-Stable Transducers

Another class of actuators according to the present invention offers yet another high-efficiency configuration amenable to high-speed use with acrylic EPAM™ material. They may also be advantageously employed with silicone as the dielectric material or in other transducer configurations. Advantageously, they include no hinge or flex points prone to wear or fatigue as in the variations discussed directly above.

Figure 23A:
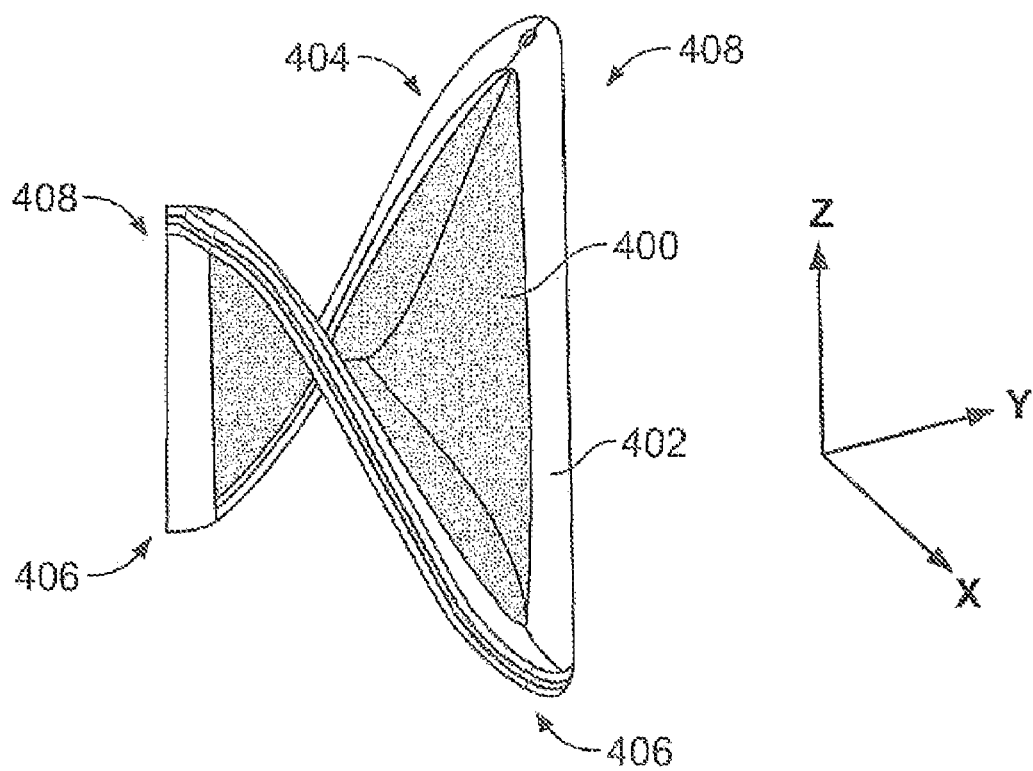
FIGS. 23A-23C show a saddle-shaped actuator in various stages of actuation.
Figure 23B:
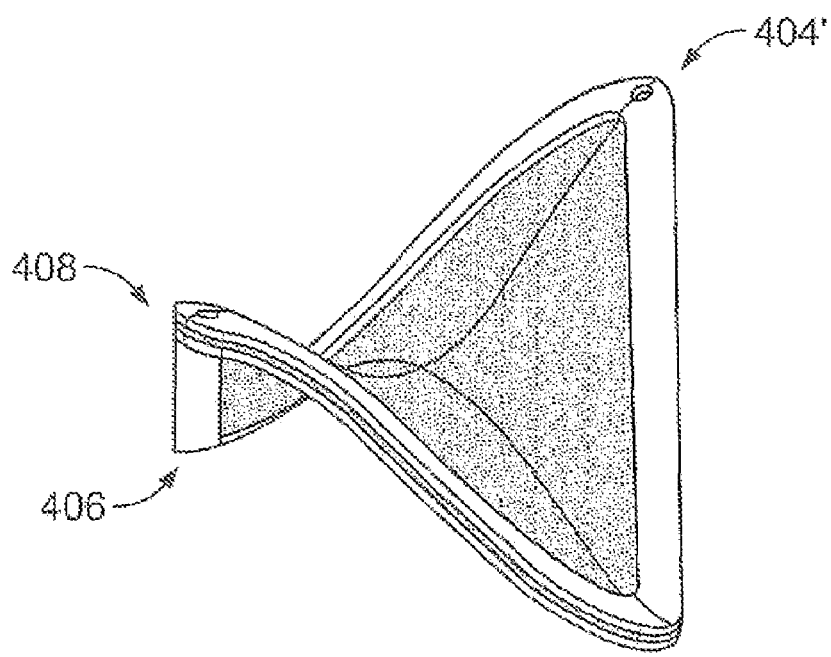
Figure 23C:
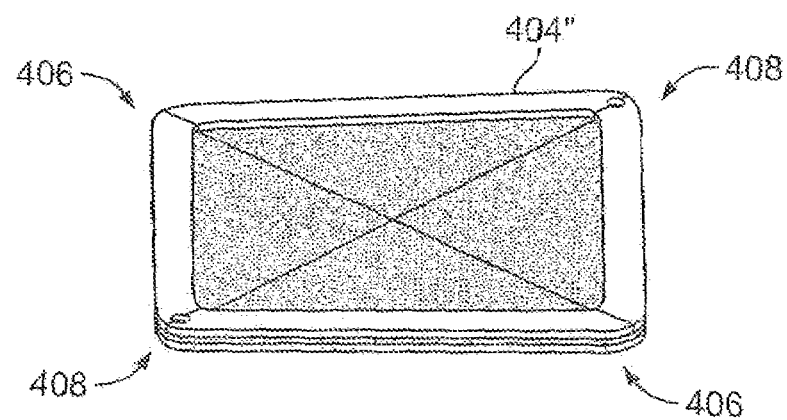

More specifically, FIGS. 23A-23C show a saddle-shaped actuator run through various stages of its stroke—at least on one side of it unstable equilibrium point. In its unpowered state, preload upon EPAM™ diaphragm 400 causes frame to essentially controllably buckle or collapse into the saddle-shape actuator configuration 404 shown in FIG. 23a. Mathematically, the form is well described using sine/cosine functions.

When the EPAM™ diaphragm is energized, its expansion (cutting across all three directional axes) allows stress in the frame to relax and assume an intermediate configuration 404' as shown in FIG. 23B. Upon maximum polymer material expansion, the frame is able to substantially flatten to configuration 404" shown in FIG. 23C. In a completely flat state, frame 402 is in an unstable equilibrium position (i.e., without power applied thereto to maintain the position).

Depending on the drive configuration associated with the frame, the actuator can be pushed-over or employ its own inertia to continue and actuate with arms/wings 406/408 reversing direction from that shown in FIGS. 23A and 23B. In this manner, the actuator offers two stable saddle-shaped equilibrium configurations or positions. Otherwise, the "flapping" action of the transducer can be constrained to one side of the unstable equilibrium position, rather than applying the optional bi-stable maximum-travel/stroke potential.

Figure 24:
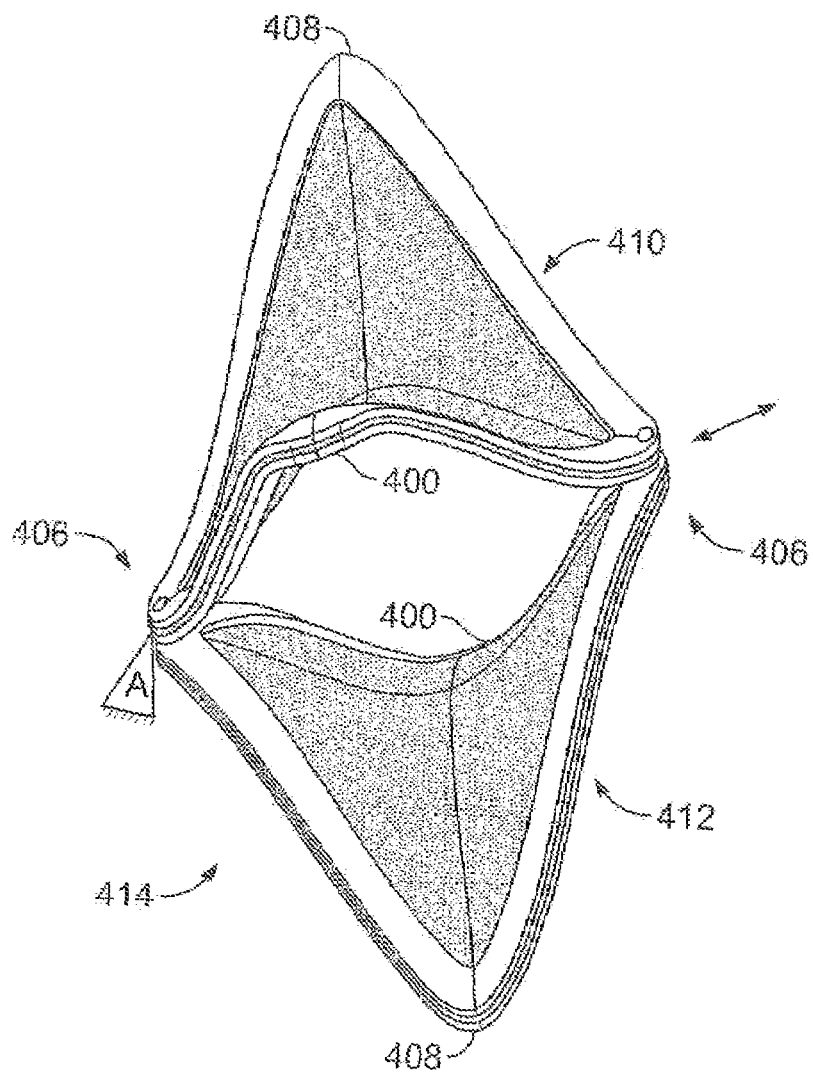
FIG. 24 shows a paired assembly of two such actuators illustrating one input/output mode.

FIG. 24 illustrates a constrained application in which two such "flapper" actuators 410, 412 are set across from each other. Connected or secured at ends 406, with one end anchored at point "A", actuation forces between the bodies are balanced (or at least substantially-so) in order to yield output along the axis of the double arrow. Alternatively, mechanical energy may drive transducer assembly 414 along the double arrow so that it serves as a generator setup.

Of course, other approaches may be employed to utilize the actuator output. When only one actuator 410 is to be used, "U" shaped yokes (or one yoke across from anchor points) can be attached to each of the opposite end pairs 406/408. As with the EPAM™ cartridges employed above, individual actuators may be staked to operate in parallel, rather than opposite one another as shown in FIG. 24. Still, further, actuators may be ganged in series to amplify stroke. Yet another example is provided below, though still others are possible as well.

However device output is harnessed, one or more such saddle-shaped device can be set-up for high-speed actuation, even using acrylic-based EPAM™ material. As with the other exemplary embodiments capable of such use, multiple-axis expansion of the polymer drives ultimate device output. In this particular case, the mass or weight tuning of the system to achieve the desired performance may occur (as in the examples in FIGS. 23A and 23B) by tuning the mass of the frame. Frame 402 may be thickened, include inset or clamp-on weights or be designed or modified otherwise to reach its target mass attributes. The mass/weight may be applied symmetrically or asymmetrically. The design will depend on the overall plan-form configuration of the actuator. Those shown are substantially square in shape. However, other forms are contemplated such as more rectangular, rhomboid, or rounded (including elliptical and circular) forms as well as others.

Figure 25A:
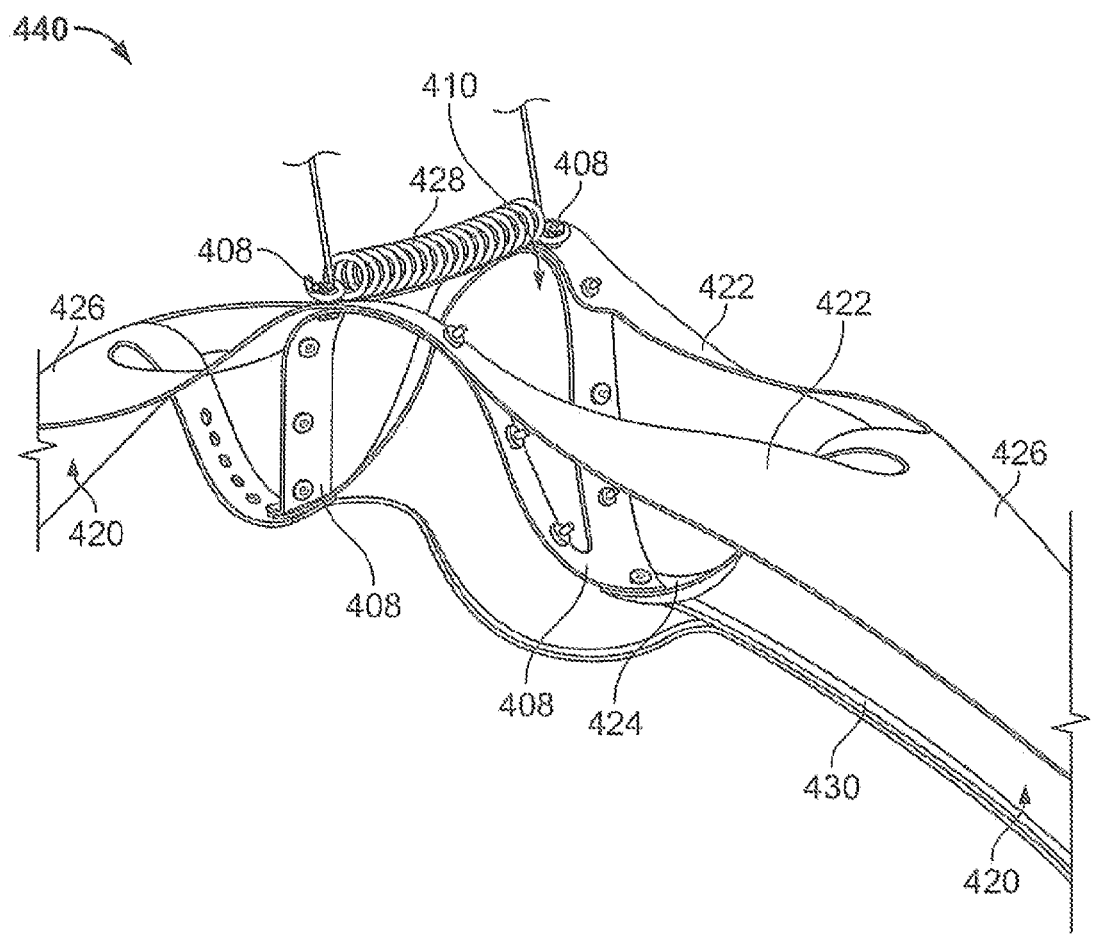
FIGS. 25A and 25B show mechanical flight system, in which FIG. 25A provides a detail view.
Figure 25B:
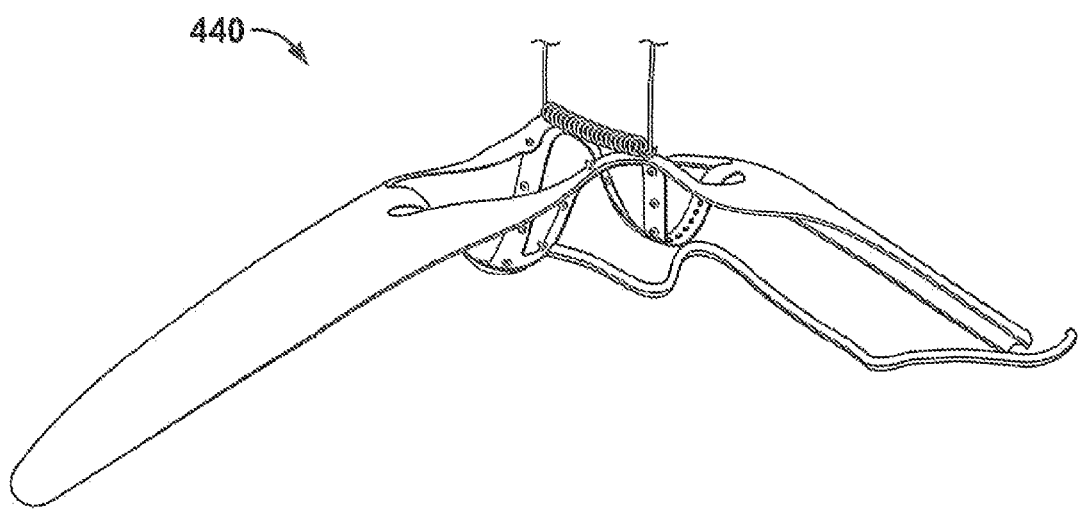

As for application, FIGS. 25A and 25B illustrate a saddle-shaped actuator 410 connected to a pair of wings 420 to offer a bird or bat-like system 440. The detail view in FIG. 25A highlights a simple and efficient connection structure. FIG. 25B illustrates the mechanical creature flapping in a time-lapse fashion with multiple wing "beats"

Returning to FIG. 25A, upper and lower flexible struts 422, 424 connect wing foil section 426 to the actuator. On each side of the system, the lower struts 426 connect to opposite ends 406 and the upper struts 422 connect to opposite ends 408 of the actuator. A spring 428 provides bias force to the system and also helps form the actuator into the shape desired as well as help "tune" the system to a particular resonance frequency. Electrical leads 430 (that could otherwise lead to an integral/portable power source) connect the actuator to an external power supply in the prototype model shown. With optimization and refinement, the system shown in FIGS. 25A and 25B holds promise for achieving flight possibilities at high or low frequency, and with bodies ranging from a wing span of several inches to several meters. Given appropriate hardware and software control, it may be programmed for gliding as well as flapping flight. Together with other control features, optional electrical solar power and regenerative power management while gliding, etc. as may be applied by those with skill in the art, this mechanized flight system offers potential to surpass even its natural counterparts in endurance, range and longevity.

Manufacture

Regardless of the configuration selected for the subject transducers, various manufacturing techniques are advantageously employed. Specifically, it is useful to employ mask fixtures (not shown) to accurately locate masks for patterning electrodes for batch construction. Furthermore, it is useful to employ assembly fixtures (not shown) to accurately locates multiple parts for batch construction. Other details regarding manufacture may be appreciated in connection with the above-referenced patents and publication as well as generally know or appreciated by those with skill in the art.

Methods

Methods associated with the subject devices are contemplated in which those methods are carried out with EPAM™ actuators. The methods may be performed using the subject devices or by other means. The methods may all comprise the act of providing a suitable transducer device. Such provision may be performed by the end user. In other words, the 'providing" (e.g., a pump, valve, reflector, etc.) merely requires the end user obtain, access, approach, position, set-up, activate, power-up or otherwise act to provide the requisite device in the subject method.

Kits

Yet another aspect of the invention includes kits having any combination of devices described herein—whether provided in packaged combination or assembled by a technician for operating use, instructions for use, etc.

A kit may include any number of transducers according to the present invention. A kit may include various other components for use with the transducers including mechanical or electrical connectors, power supplies, etc. The subject kits may also include written instructions for use of the devices or their assembly.

Instructions of a kit may be printed on a substrate, such as paper or plastic, etc. As such, the instructions may be present in the kits as a package insert, in the labeling of the container of the kit or components thereof (i.e., associated with the packaging or sub-packaging) etc. In other embodiments, the instructions are present as an electronic storage data file present on a suitable computer readable storage medium, e.g., CD-ROM, diskette, etc. In yet other embodiments, the actual instructions are not present in the kit, but means for obtaining the instructions from a remote source, e.g. via the Internet, are provided. An example of this embodiment is a kit that includes a web address where the instructions can be viewed and/or from which the instructions can be downloaded. As with the instructions, this means for obtaining the instructions is recorded on suitable media.

Variations

As for other details of the present invention, materials and alternate related configurations may be employed as within the level of those with skill in the relevant art. The same may hold true with respect to method-based aspects of the invention in terms of additional acts as commonly or logically employed. In addition, though the invention has been described in reference to several examples, optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. Any number of the individual parts or subassemblies shown may be integrated in their design. Such changes or others may be undertaken or guided by the principles of design for assembly.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in the appended claims, the singular forms "a," "an," "said," and "the" include plural referents unless the specifically stated otherwise. In other words, use of the articles allow for "at least one" of the subject item in the description above as well as the claims below. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth n the claims. For example, adding a fastener or boss, complex surface geometry or another feature to a "diaphragm" as presented in the claims shall not avoid the claim term from reading on accused structure. Stated otherwise, unless specifically defined herein, all technical and scientific terms used herein are to be given as broad a commonly understood meaning as possible while maintaining claim validity.

In all, the breadth of the present invention is not to be limited by the examples provided. That being said,

What is claimed is:

1. An electroactive polymer actuator comprising:
   an open frame and electroactive polymer material stretched within the frame to form a diaphragm, wherein a first stable equilibrium configuration the electroactive polymer material deforms the open frame causing the diaphragm to form a non-planar shape,
   wherein the diaphragm is adapted to actuate in at least two substantially opposite directions upon application of voltage, such that a second stable equilibrium position is directionally opposite to the first stable equilibrium configuration, and
   wherein the actuator is adapted to have a stroke range between the first and second stable equilibrium configurations, wherein the actuator is in a less stable configuration when in between the first and second stable equilibrium configurations.

2. The actuator of claim 1, wherein the frame is configured to bias the diaphragm toward a stable equilibrium configuration.

3. The actuator of claim 1, wherein the non-planar shape comprises a saddle-shape.

4. The actuator of claim 3, wherein orthogonal sine or cosine functions characterize the saddle-shape.

5. A bi-stable electroactive polymer transducer comprising:
   an open frame and electroactive polymer material stretched within the frame to form a diaphragm such that when in a stable equilibrium configuration the electroactive polymer material deforms the oven frame to cause the diaphragm to form a non-planar shape,
   wherein the transducer is moveable from the non-planar shape to a less stable and more flattened configuration upon the application of a voltage.

6. The bi-stable transducer of claim 5, wherein orthogonal sine or cosine functions characterize the saddle-shaped configuration.

7. The bi-stable transducer of claim 5, wherein die transducer is biased by the frame toward the saddle-shaped configuration.

8. An electroactive polymer actuator system comprising:
   an open frame and electroactive polymer material stretched within the frame to form a diaphragm, such that in an unpowered state the diaphragm is deformed into a non-planar shape,
   the actuator adapted to produce a flapping motion by cycling voltage application thereto where application of the voltage causes the diaphragm in to move towards a planar shape.

9. The system of claim 8, further comprising a pair of wings adjacent opposite sides of the actuator and armature members connecting the wings to the actuator to transmit the flapping motion of the actuator to yield a flapping motion of the wings.

10. The system of claim 8, wherein the actuator is biased by a spring mechanism.

11. The actuator of claim 1, wherein the actuator is adapted to have an unstable equilibrium point between the first and second stable equilibrium configurations, wherein the actuator, when powered, has a stroke range between the first or second stable equilibrium configuration and a less stable configuration on at least one side of the unstable equilibrium point.

12. The actuator of claim 1, wherein the actuator, when powered, controllably moves from the first or second stable equilibrium configuration to a less stable configuration.

13. The actuator of claim 1, wherein the actuator, when powered, controllably moves from the first stable equilibrium configuration to the second stable equilibrium configuration.

14. The actuator of claim 1, wherein the diaphragm is biased by a single biasing means.

15. The actuator of claim 14, wherein the single biasing member comprises the frame.

16. The actuator of claim 15, wherein the frame's mass or weight is tuned to achieve the desired performance of the actuator.

17. An electroactive polymer transducer comprising:
   an open frame and electroactive polymer material stretched within the frame to form a diaphragm, such that in an unpowered state the diaphragm is deformed into a non-planar shape,
   wherein upon the application of voltage the diaphragm is adapted to controllably buckle from a first configuration to a second configuration.

18. The transducer of claim 17, wherein the frame includes no hinge points.

19. The transducer of claim 17, wherein the frame is adapted to flex in a direction substantially perpendicular to a face of the diaphragm.

20. The transducer of claim 17, wherein the first configuration is a saddle-shaped configuration.

21. An electroactive polymer actuator system comprising:
   an open frame and electroactive polymer material stretched within the frame to form a diaphragm,
   the actuator adapted to produce a flapping motion by cycling voltage application thereto,
   a pair of wings adjacent opposite sides of the actuator and armature members connecting the wings to the actuator to transmit the flapping motion of the actuator to yield a flapping motion of the wings.

* * * * *